United States Patent [19]
Van Der Werf et al.

[11] Patent Number: 6,046,792
[45] Date of Patent: Apr. 4, 2000

[54] DIFFERENTIAL INTERFEROMETER SYSTEM AND LITHOGRAPHIC STEP-AND-SCAN APPARATUS PROVIDED WITH SUCH A SYSTEM

[75] Inventors: Jan E. Van Der Werf; Peter Dirksen, both of Eindhoven, Netherlands

[73] Assignee: U.S. Philips Corporation, New York, N.Y.

[21] Appl. No.: 08/812,283

[22] Filed: Mar. 6, 1997

[51] Int. Cl.[7] .............................. G03B 27/42; G01B 9/02
[52] U.S. Cl. .............................................. 355/53; 356/351
[58] Field of Search .................................. 355/53, 51, 67; 356/358, 363, 344, 401, 400

*Primary Examiner*—Safet Metjahic
*Assistant Examiner*—Timothy Thompson
*Attorney, Agent, or Firm*—Bernard Franzblau

[57] ABSTRACT

A differential interferometer system for measuring the mutual positions and movements of a first object (WH) and a second object (MH). The system comprises a first interferometer unit (1, 2, 3, 4) having a first measuring reflector (RW) and a second interferometer unit (5, 6, 7, 8) having a second measuring reflector (RM). Since a measuring beam ($b_m$) passes through both the first and the second interferometer unit and is reflected by both the first and the second measuring reflector, and since the measuring beam and the reference beam ($b_r$) traverse the same path at least between the two interferometer units, accurate measurements can be preformed very rapidly. The interferometer system may be used to great advantage in a step-and-scan-lithographic projection apparatus.

14 Claims, 18 Drawing Sheets

DIFFERENTIAL INTERFEROMETER SYSTEM AND LITHOGRAPHIC STEP-AND-SCAN APPARATUS PROVIDED WITH SUCH A SYSTEM

BACKGROUND OF THE INVENTION

This invention relates to an interferometer system for measuring the mutual position and movement of a first and a second object in at least one direction, said system comprising, for at least one of all possible mutual directions of movement:

a first interferometer unit, associated with the first object, provided with a fist beam splitter, a first measuring reflector and a plurality of first reflectors, and a second interferometer unit, associated with the second object, provided with a second beam splitter, a second measuring reflector and a plurality of second reflectors.

The invention also relate to a lithographic apparatus for projecting a mask pattern on a substrate in accordance with the step-and-scan principle.

Such an apparatus, which is known as a step-and-scan apparatus and can be used, inter alia, in the manufacture of integrated circuits, or ICs, is known from, inter alia, U.S. Pat. No. 5,194,893.

Due to the demand for increasing numbers of electronic components in an IC, increasingly smaller details, also referred to as line widths, must be imaged by means of the projection apparatus in every area of the substrate on which an IC must be formed, which area is also referred to as IC area or "die". Moreover, it is also desirable to enlarge the IC areas so that the number of components per IC can also be increased in that way. For the projection lens system, this means that the resolving power, hence its numerical aperture, must be raised and that the image field must be increased.

Hitherto it has been possible, albeit with much trouble and at a high expense, to find an optimum between these two contradictory requirements for a projection lens system. For example, for a stepping apparatus, known as wafer stepper, a projection lens system having a numerical aperture of 0.6 and an image field of 22 mm has been made for the manufacturer of ICs of the 64 Mbit type. Line widths of 0.35 $\mu$m can be imaged on the substrate by means of this projection lens system. The limit of a projection lens system which can still be made and is not too unwieldy is then virtually achieved. If even smaller details are to be imaged, i.e., if even smaller line widths are to be formed on the substrates, in other words, if the projection lens system must be given an even larger numerical aperture, then this will only be at the expense of the image field size.

A way out of this dilemma is possible by changing from a stepping projection apparatus to a step-and-scan apparatus as described in U.S. Pat. No. 5,194,893. In a stepping projection apparatus, the full mask pattern is exposed and imaged in one run on an IC area on the substrate. Subsequently, a step is made, i.e. the substrate is moved with respect to the projection lens system and the mask pattern until a second IC area is situated opposite the mask pattern and within the image field of the projection lens system, and a second image of the mask pattern is formed in the area. Subsequently a step is made to a third IC area and imaged again, and so forth until images of the mask patterns have been formed in all IC areas. In a step-and-scan apparatus, the same stepping movements are performed, but every time only a small part of the mask pattern is imaged on corresponding partial area of the substrate. By imaging consecutive parts of the mask pattern on consecutive partial areas of the IC area, an image of the entire mask pattern is obtained on an IC area. To this end, the mask pattern is exposed with a projection beam which has a small cross-section, for example a rectangular or arcuate cross-section, at the area of the mask pattern, and the mask table and the substrate table are moved in opposite sense in a direction, the scanning direction, with respect to the projection lens system and the projection beam, the speed of movement of the substrate table being M times that of the mask table. M is the magnification with which the mask pattern is imaged. A conventional value for M is currently ¼, but other values, for example 1, are alternatively possible.

The projection beam cross-section has its largest dimension in the direction transverse to the scanning direction. This dimension may be equal to the width of the mask pattern, so that this pattern is imaged in one scanning movement. However, it is alternatively possible that said dimension is half that of the mask pattern or is even smaller. In that case, the entire mask pattern is imaged in two or more opposite scanning movements. It should then be ensured that the movements of the mask and the substrate are synchronized very accurately, i.e. the speed v of the mask should always be equal to M times the speed of the substrate.

As compared with stepping projection apparatus, in which the mask pattern is already aligned accurately with respect to the IC areas on the substrate and in which the projection lens system must be accurately focused on the substrate and the stepping substrate table must be accurately inspected, the condition of speed must be additionally measured in a step-and-scan projection apparatus, in other words, whether the substrate and the mask pattern stand still, as it were, with respect to each other during scan-imaging of the substrate and the mask pattern. Based on this measurement, the speed of one of the tables can then be adapted to that of the other.

In the projection apparatus as disclosed in U.S. Pat. No. 5,194,893, two interferometer systems are used to check the condition of speed. The measuring reflector of the first interferometer system is secured to the substrate table so that the displacement of the substrate table in the scanning direction, hereinafter also referred to as the X direction can be measured with this system. The measuring reflector of the second interferometer system is secured to the mask table, so that the displacement of this table to the scanning direction can be measured with this system. The output signals from the two interferometer systems are applied to an electronic processing unit, for example a microcomputer, in which the signals are subtracted from each other and processed to control signals for the actuators, or driving devices, for the tables.

Due to the high speeds of the tables, required because of the desired large feed-through rate of the substrates through the apparatus, the interferometer signals have a high frequency, or bitrate. When comparing these high-frequency signals, the speed of the processing electronics becomes a limiting factor. Then the delay time, i.e., the time elapsing between the instant when a measurement is performed an the instant when the measuring result becomes available, will play a large role. In a closed servoloop comprising the measuring systems and the actuators or driving devices for the tables, delay time differences in the electronic signal processing will lead to an unwanted offset between the mask table and the substrate table. Moreover, the tables will then have a limited maximum speed.

SUMMARY OF THE INVENTION

The present invention provides a novel measuring concept for a step-and-scan projection apparatus obviating the above-mentioned problems. This novel concept has a number of aspects which may be used separately or in combination.

In accordance with a first aspect of the invention, the interferometer system is characterized in that, in operation, a measuring beam passes through both the first and the second interferometer unit and is reflected at least once by both the first measuring reflector and the second measuring reflector, in that the first and second interferometer units have a common radiation-sensitive detector, and in that the reference beam associated with the measuring beam traverses the same path as the measuring beam between the first and the second interferometer unit.

The position signals of the two tables are now no longer compared electronically, or subtracted from each other, but compared optically and in the interferometer system itself. For a controlled system, i.e. a closed servoloop, the frequency of the interferometer signal will always be independent of the speed of the tables, so that this speed can no longer be a restrictive factor.

It is to be noted that an interferometer system having a first and a second measuring reflector and a first and a second beam splitter is described in the English-language abstract of Japanese Patent Application 3-199.905, in which a measuring beam is used which passes the first and the second beam splitter. However, in the known system the measuring beam is reflected by only one of the measuring mirrors, whereas the other measuring mirror reflects a reference beam. Moreover, the known system is not used for measuring the mutual movement, in one direction, of two objects but for measuring the relative displacement of an X table with respect to a Y table.

An embodiment of the differential interferometer system which is notably suitable for use in a lithographic apparatus, in which the mask pattern is imaged in a reduced size, is further characterized in that the ratio between the number of times the measuring beam is reflected by the measuring reflector associated with the first object and the number of times the measuring beam is reflected by the measuring reflector associated with the second object is equal to the ratio between the speed of the second object and the speed of the first object.

The interferometer system is preferably further characterized in that the second interferometer unit is adapted in such a way that the measuring beam coming from the first interferometer unit is reflected m+1 times in the second interferometer unit before returning to the first interferometer unit, m being an even number which is larger than 2.

This measure prevents a tilt or rotation of the first object from influencing the interferometer signal.

The invention also relates to an apparatus for imaging a mask pattern on a substrate a number of times in accordance with the step-and-scan principle, which apparatus comprises a mask holder arranged in a mask table, a substrate holder arranged in a substrate table and a projection system arranged between the mask table and the substrate table. This apparatus is characterized by an interferometer system as described above for measuring the mutual position of the mask and the substrate constituting the first and the second object.

The use of the invention is not limited to a step-and-scan projection apparatus. It may generally be used in circumstances and apparatuses in which two bodies must be moved rapidly and very precisely with respect to each other.

If a mask pattern having a magnification M is imaged on a substrate in this projection apparatus, it may be further characterized in that the ratio between the number of times the measuring beam is reflected by the measuring reflector associated with the substrate and the number of times the measuring beam is reflected by the measuring reflector associated with the mask is equal to 1/M.

In accordance with a further aspect of the invention, this apparatus is further characterized in that a measuring reflector associated with the substrate and a measuring reflector associated with the mask are constituted by a reflecting side face of the substrate holder and the mask holder, respectively.

A reflecting side face is understood to mean that the side face itself is reflective or that a reflector is secured to this side face.

Since the measuring reflectors are rigidly connected to the substrate and the mask, the movements of these elements themselves are measured directly and hence reliably, including the movements which are left outside of consideration in known apparatuses and result from movements of substrate table elements relative to each other and movements of mask table elements relative to each other.

For the way in which an interferometer system can be constructed for measuring linear displacements, rotations and tilts of a substrate, hereinafter referred to as substrate interferometer, and how it can be built into a lithographic projection apparatus, reference is made to U.S. Pat. Nos. 4,251,160 and 4,737,283 describing a two-axis interferometer system and a three-axis interferometer system, respectively. Further embodiments of a substrate interferometer system are described in EP Patent Application 0 498 499.

The apparatus according to the invention is preferably further characterized in that the interferometer system comprises a projection system interferometer unit for measuring the position of the projection system at one location, and in that the projection system is provided with a further measuring reflector at said location.

The position of the projection system can then be measured independently of a possible tilt of this system.

A further preferred embodiment of the apparatus is further characterized in that the projection system is provided with two further measuring reflectors at locations proximate to the mask holder and proximate to the substrate holder, respectively, and in that said reference beam is reflected by both measuring reflectors.

These and other aspects of the invention will be apparent from and will be elucidated with reference to the embodiment described hereinafter.

DESCRIPTION OF THE PREFERRED EMBODIMENTS

Figure 1:
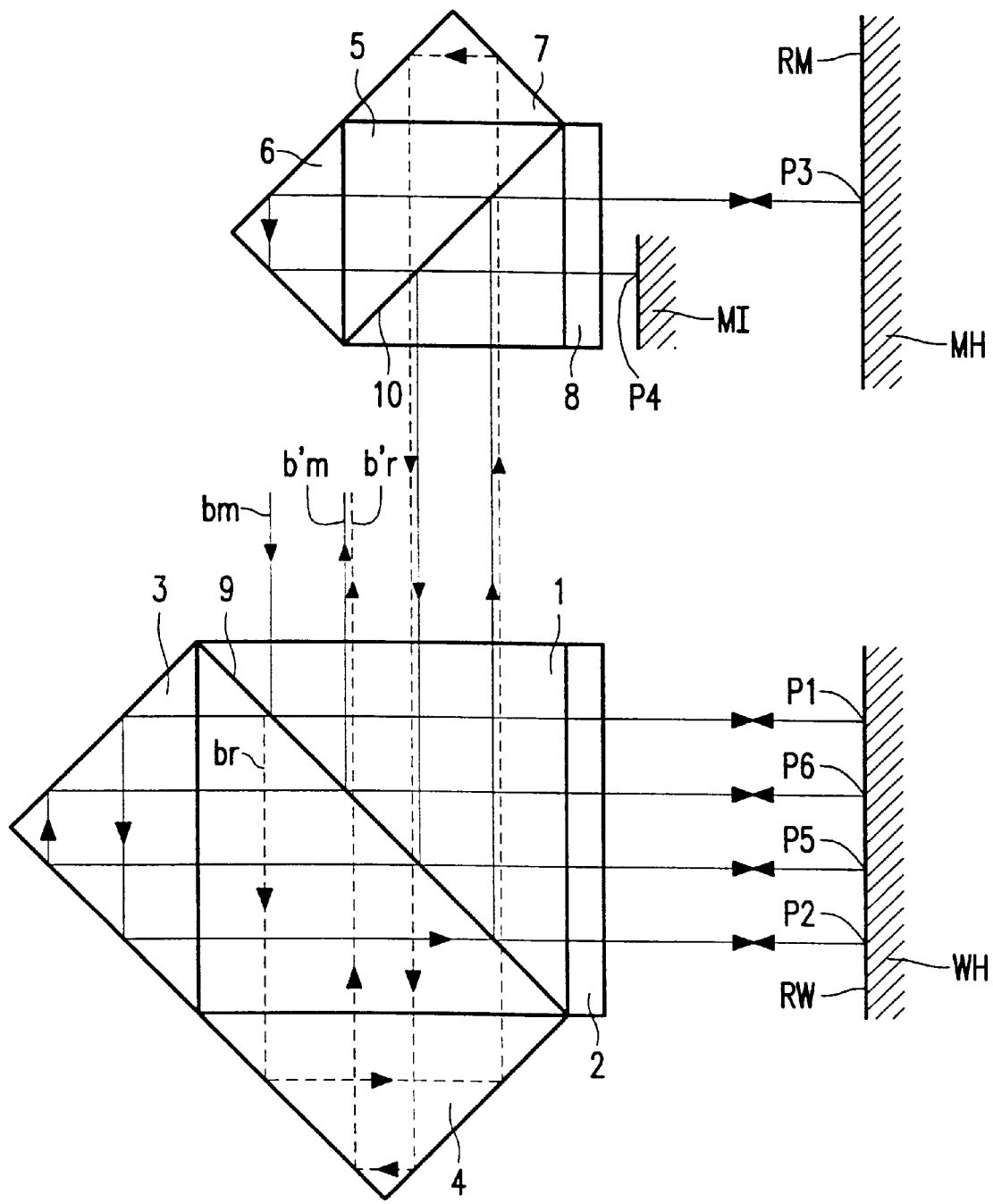
FIGS. 1 and 2 show two embodiments of the interferometer system according to the invention for an apparatus with a magnification M=¼.

FIG. 1 shows a first embodiment of an interferometer system according to the invention for use in an projection apparatus in which the mask pattern is imaged in a reduced size four times, hence M=¼. This Figure and further Figures of the projection apparatus only show those elements with which the differential interferometer system cooperates, namely the mask holder MH provided with the reflector RM and the substrate holder WH provided with the reflector RW. The measuring beam $B_m$ emitted by a radiation source (not shown) and the reference beam $b_r$ are denoted by solid lines and broken lines, respectively. These beams are, for example, the two mutually perpendicularly polarized components having different frequencies of a radiation beam, emitted by a Zeeman laser, so that the measurement is based on a phase measurement. The direction of the measuring beam and the reference beam is denoted by arrows.

At the location of the substrate holder WH provided with a reflector RW, the embodiment shown in FIG. 1 comprises a polarization-sensitive beam splitter 1, a quarter-wavelength (λ/4) plate 2 and two retroreflectors 3 and 4. A polarization-sensitive beam splitter 5, a λ/4 plate 8 and two retroreflectors 6 and 7 are also present at the location of the mask holder MH provided with a reflector RM. Moreover, a stationary reflector MI is present in situ. The beam splitters 1 and 5 have polarization-sensitive interfaces 9 and 10 which pass a first component having a first direction of polarization of the beam from the source and a second component having a second direction of polarization perpendicular to the first direction of polarization, and reflect them, or conversely. In the embodiment shown the passed beam component is the reference beam $b_r$ and the reflected component is the measuring beam $b_m$. The quarter-wavelength plates 2 and 8, which have a direction of polarization at an angle of 45° to that of the beam components, ensure that the direction of polarization of a beam component is rotated through 90° if this component passes such a plate twice.

The measuring beam $b_m$ passed by the interface 9 traverse the λ/4 plate 2 and impinges upon the reflector RW at the position P1. The reflected beam traverses the λ/4 plate a second time so that its direction of polarization is rotated 90° with respect to the original direction of polarization, and is then passed by the interface 9 towards the retroreflector 3. Via reflections on the oblique faces of this reflector, the measuring beam enters the beam splitter 1 again and is then passed by this beam splitter so as to impinge upon the reflector RW a second time, at the position P2. The measuring beam coming from the position P2 is reflected by the interface 9 to the interface 10 of the beam splitter 5 placed proximate to the mask holder. Subsequently, the interface 10 reflects the measuring beam via the λ/4 plate 8 to the mask holder reflector RM where the measuring beam is incident at the position P3. The measuring beam reflected by the reflector RM traverse the λ/4 plate a second time so that its direction of polarization is rotated 90° again and is passed by the interface to the retroreflector 6. Via reflections on the oblique sides of this reflector and passage through the interface 10 and the λ/4 plate 8, the beam reaches the reflector MI, at the position P4. The beam reflected by the reflector MI again traverses the λ/4 plate 8 so that its direction of polarization is again rotated 90° so that this beam is reflected by the interface 10 to the interface 9. Then, the measuring beam is again sent to the substrate reflector RW so as to be consecutively incident and reflected at the positions P5 and P6, analogously as described for the positions P1 and P2. The beam reflected at the position P6 is reflected by the interface 9 from the interferometer system towards a detector (not show).

The reference beam $b_r$ passed by the interface 9 also traverses the entire system, but it bypasses the reflectors RW, RM and MI. This beam is only reflected by the side faces of the retroreflectors 4 and 7 ad is always passed by the interfaces 9 and 10 of the beam splitters 1 and 5. The mutually perpendicular polarized beams $b_m$ and $b_r$ emerging from the system pass an analyzer (not shown) on their way to the detector, which analyzer has a direction of polarization extending at an angle of 45° to that of the beams, and passes two components of this beam, which components can interfere with each other. The phase difference between these beam components is dependent on the mutual position of the mirrors RM and RW, hence on the extent to which the mirrors, and thus the mask and the substrate, move synchronously, taking the magnification M into account. In the lithography apparatus, a projection lens system, not show in FIG. 1, is situated between the mask holder MH and the substrate holder WH. For the embodiment of the interferometer system shown in FIG. 1, in which the measuring beam is reflected four times on the substrate reflector and once on the mask reflector, this projection lens system has a magnification M of ¼.

Figure 2:
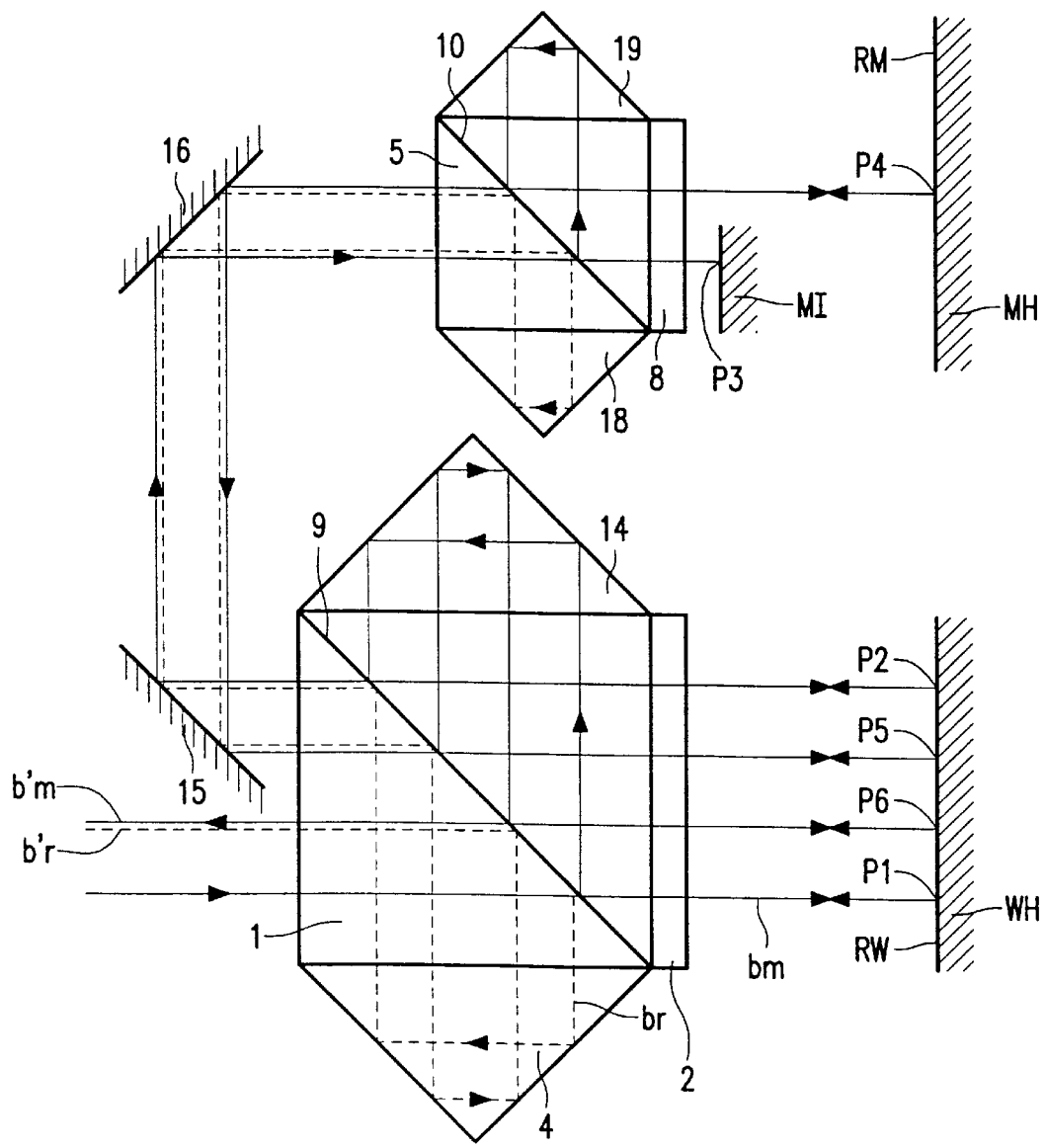

FIG. 2 shows a second embodiment of a differential interferometer system for use in a projection apparatus having a magnification M=¼. This embodiment differs from that of FIG. 1 in that two extra reflectors 15 and 16 are incorporated, in that the first retroreflector 3 associated with the first beam splitter 1 is omitted and the retroreflectors 6 and 7 of FIG. 1 at the second beam splitter are replaced by the retroreflectors 18 and 19. In this embodiment, the measuring beam $b_m$ entering from the left is first reflected twice by the substrate reflector RW at the positions P1 and P2 via the beam splitter 1 and the $\lambda/4$ plate 2. The reflectors 15 and 16 reflect the measuring beam reflected at the position P2 to the stationary reflector MI. The measuring beam reflected by this reflector at the position P3 is reflected by the interface 10 to the retroreflector 19. Via reflections on the oblique sides of the reflector 10, the measuring beam is sent back to the interface 10 where it is reflected to the position P4 on the mask reflector RM. The measuring beam from this reflector travels via reflections on the reflectors 16 and 15 to the position P5 on the substrate reflector RW. There, the measuring beam is reflected again and subsequently the beam is again passed via reflections consecutively on the interface 9, the two oblique sides of the retroreflector 14 and again the interface 9 to the position P6 on the substrate reflector RW. The measuring beam b' which is reflected there reaches a detector (not shown) via the $\lambda/4$ plate 2 and the beam splitter 1.

The reference beam $b_r$ is passed through the system by reflections consecutively on the interface 9, the two oblique sides of the retroreflector 4, the interface 9, the reflectors 15 and 16, the interface 10, two oblique sides of the reflector 18, the reflectors 16 and 15, the interface 9, the two oblique sides of the reflector 4, and is finally sent via reflection on the interface 9 as beam b' to the same detector as the measuring beam b'. The reference beam b thus bypasses all reflectors RW, RW and MI.

Figure 3:
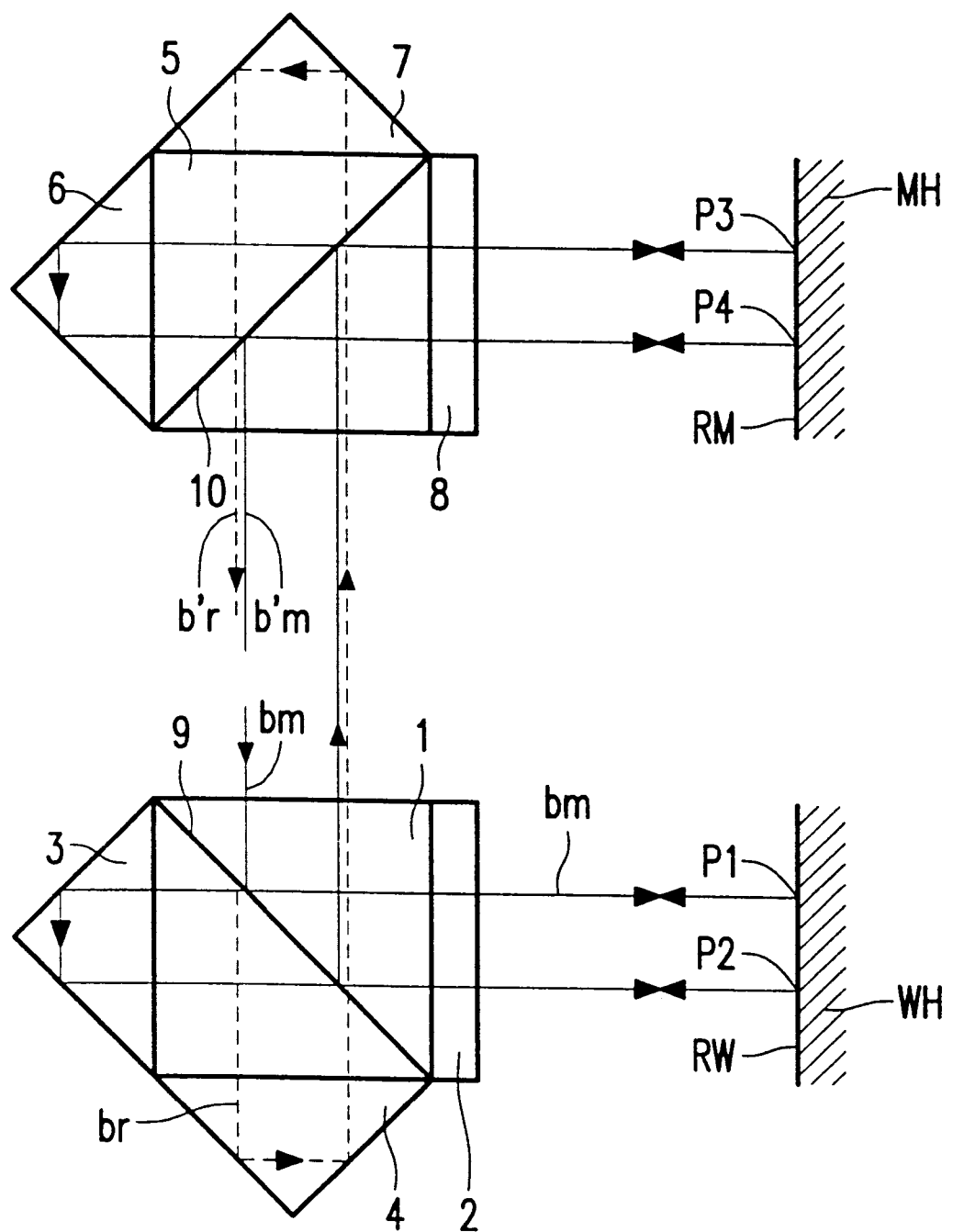
FIGS. 3 and 4 show two embodiments of the interferometer system according to the invention for an apparatus with a magnification M=1.

FIG. 3 shows an embodiment of the differential interferometer system for use in a projection apparatus having a magnification M=1. In this embodiment, in which the stationary reflector MI is absent but which has the same structure as that in FIG. 1, the measuring beam $B_m$ is first reflected by the substrate reflector RW twice consecutively at the positions P1 and P2. The measuring beam coming from the position P2 is passed via reflections on the interfaces 9 and 10 to the position P3 on the mask reflector RM where it is reflected. The reflected measuring beam is subsequently passed via reflections on the oblique sides of the retroreflector 6 to the position P4 on the mask reflector RM where it is reflected again to the interface 10. This interface reflects the measuring beam $b'_m$ to a detector (not shown).

The reference beam $b_r$ is passed by the interfaces 9 and 10 of the beam splitters 1 and 5 and reflected only by the oblique sides of the retroreflectors 4 and 7. This beam bypasses one of the reflectors RW and RM.

Figure 4:
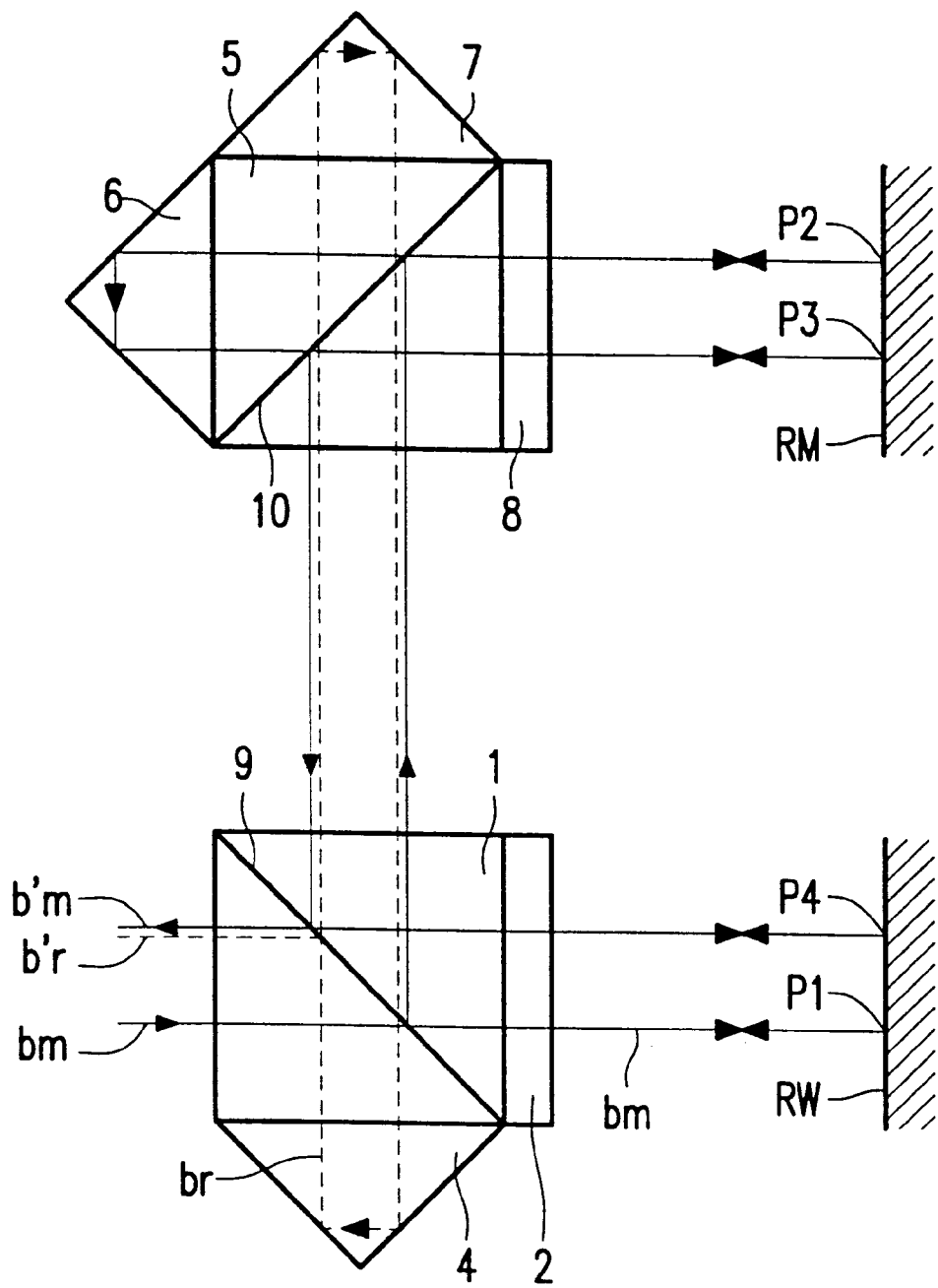

FIG. 4 shows a second embodiment of the differential interferometer system for use in a projection apparatus having a magnification M=1. This embodiment differs from that shown in FIG. 3 in that an extra $\lambda/4$ plate 20 is arranged under the first beam splitter 1 and the retroreflector 3 has been omitted. The measuring beam $b_m$ entering from the left is first reflected by the substrate mirror RW at the position P1. Subsequently, the measuring beam is passed to the position P2 on the mask reflector RM via reflections on the interfaces 9 and 10. The measuring beam reflected at this reflector is reflected to the position P3 on the mask reflector RM by the oblique sides of the retroreflector 6. Via reflections on the interfaces 10 and 9, the measuring beam returns to the substrate reflector RW where it is reflected as beam $b'_m$ at the position P4 towards a detector (not shown).

The $\lambda/4$ plate 20 is situated in the path of the reference beam $b_r$ only and ensures that this beam, which is first reflected by the interface 9, is passed towards the retroreflector 7 by the interfaces 9 and 10 after reflection on the oblique sides of the retroreflector 4. Via reflections on the two oblique sides of this reflector, the reference beam is sent back to the retroreflector 4. The interface 9 finally sends the reference beam coming from this reflector as beam $b'_r$ to the detector which also receives the measuring beam b'.

The differential interferometer system according to the invention may not only be used in a step-and-scan projection apparatus having a magnification M=¼, or M=1, but also in, for example such an apparatus having a magnification M=½. A differential interferometer system adapted for this purpose may have the same structure as that shown in FIGS. 1 and 2, while the stationary reflector MI has been removed. Generally, the differential interferometer system may be used in a projection apparatus with a magnification M, in which the system is then constructed in such a way that the total optical path length for the measuring beam does not change and that the ratio between the number of times the measuring beam is reflected by the substrate reflector and the number of times the measuring beam is reflected by the mask reflector is 1/M. Also if the latter condition is not satisfied, the bitrate of the interferometer signal can be considerably reduced with respect to known systems when using the inventive idea of reflecting the measuring beam both on the substrate reflector and on the mask reflector. It is important in the interferometer system according to the invention that the measuring beam and the reference beam cover the same path as much as possible. This is notably important in a lithographic projection apparatus because there may be a large distance between the substrate holder and the mask holder in such an apparatus.

In FIGS. 1–4, only the substrate holder WH and the mask holder MH of the lithographic projection apparatus are shown diagrammatically. As described in the afore-cited U.S. Pat. No. 5,194,893, a projection lens system is arranged between these holders. Moreover, the substrate holder and the mask holder form part of a substrate table (stage) and a mask table, respectively, with which the substrate and the mask can be displaced and positioned with respect to each other. These movements are performed under the control of interferometer systems. In more conventional step-and-scan apparatuses, the position of the mask as well as the substrate is measured with respect to an apparatus reference. However, vibrations and other instabilities in the apparatus then have a disturbing influence on the determinations of the positions of the substrate and the mask. Since the mutual position of the mask and the substrate is the most important factor for a well-defined scanning movement, it is better to measure this mutual position directly, as already proposed in said U.S. Pat. No. 5,194,893. As already stated hereinbefore, magnification of the projection lens system but also the Z position of this system, i.e. the position along a Z axis of a system of coordinates of the apparatus must be taken into account. The scanning direction, which may be represented by a horizontal line in FIGS. 1–4, is then, for example, the X direction of this system of coordinates.

It must be ensured that the mask and the substrate are and remain well aligned with respect to each other in the X and Y directions with an accuracy of the order of, for example 10 nm.

For the initial, or global, X and Y alignment, the apparatus comprises a separate alignment system, for example, the system described in U.S. Pat. No. 4,251,160, which aligns special mask alignment marks with respect to special substrate alignment marks. In the Z direction, both the mask and the substrate must be accurately positioned with respect to the projection lens system. The Z position of the substrate will respect to the projection lens system can be adjusted accurately by means of a focus and leveling system as described, for example in U.S. Pat. No. 5,191,200. An erroneous Z position of the mask initially causes magnification errors. To prevent these errors, the distance between the mask and the projection lens system should be and remain adjusted with an accuracy of, for example 1 µm. This can be realized by means of a satisfactory air bearing between the mask and the projection lens system.

The mutual X and Y positions of the mask and substrate should then also be measured. Furthermore, as described in EP Patent Application 0 489 499, the tilt of the substrate about the X axis and the Y axis, $\phi_x$ and $\phi_y$, may be measured to prevent Abbe errors, for which purpose an interferometer system having five measuring axes can be used for the substrate. The five parameters: X position, Y position, the tilts $\phi_x$ and $\phi_y$ about the X axis and the Y axis and the rotation about the Z axis, $\phi_z$, and be determined from the combination of the signals of these measuring axes.

Figure 5A:
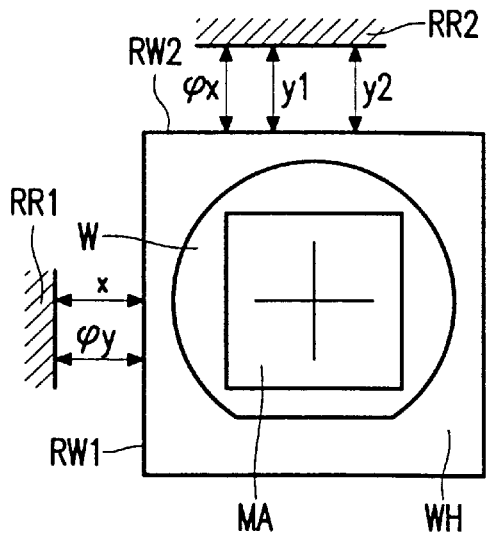
FIG. 5 shows the difference between the interferometric measurements in a known apparatus and in an apparatus according to the invention.

These measuring axes are shown in FIG. 5a. In this very diagrammatic Figure, the substrate is denoted by W, the mask is denoted by MA and the substrate holder is denoted by WH. The references RR1 and RR2 denote stationary reference reflectors with respect to which the positions and orientations of the substrate reflectors $RW_1$ and $RW_2$ are measured. The interferometer system comprises two units, a first of which cooperates with the reflector $RW_1$ and has two measuring axes, and the second cooperates with the reflector $RW_2$ and has three measuring axes. The X position of the substrate is measured along the X measuring axis with the first interferometer unit. This unit has a second measuring axis denoted by $\phi_y$, which also extends in the X direction but is offset in the Z direction with respect to the first measuring axis. The tilt about the Y axis, $\phi_y$, can be determined from the difference between the signal coming from the first and second X measuring axes. The second interferometer unit has a first Y measuring axis, denoted by Y1, with which the Y position of the substrate can be determined. The tilt about the X axis, $\lambda_x$, can be determined from the combination of the signals of this measuring axis and from that denoted by $\phi_x$ and offset with respect to Y1 in the Z direction. The rotation of the substrate about the Z axis, $\phi_z$, can be determined from the combination of the signals of the measuring axes Y1 and Y2 offset with respect to each other in the X direction.

Figure 5B:
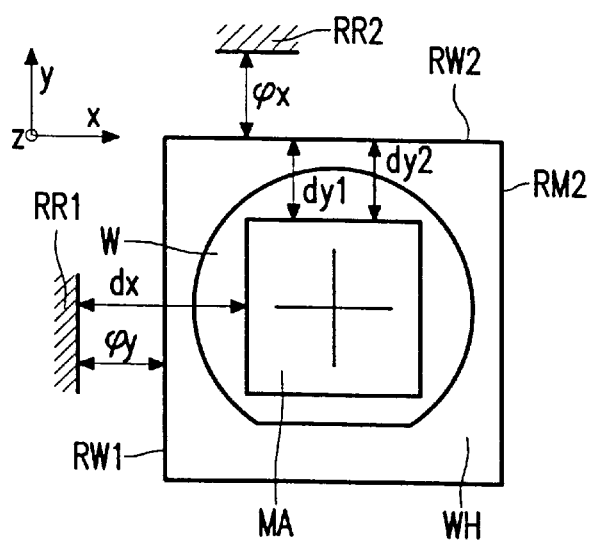

For separately determining the position and orientation of the mask, an interferometer system having three measuring axes would be necessary, namely for determining the X position, the Y position and the rotation about the Z axis. By measuring differentially, the number of measuring axes of the total interferometer system may be reduced from eight to five, as is shown in FIG. 5B. As is indicated by means of the X measuring axis dx, the relative position of the mask with respect to the substrate is now measured. Moreover, as is indicated by the measuring axes $dy_1$ and $dy_2$, the relative Y position of the mask with respect to the substrate and the relative rotation $\phi_z$ about the Z axis of the mask and the substrate with respect to each other are measured. Moreover, the tilt about the Y axis and that about the X axis of the substrate must be measured, which is realized by means of a second X measuring axis, $\phi_y$, and a second Y measuring axis, $\phi_x$, to the substrate. For the differential measuring axes $dx_1$ $dy_1$ and $d_2$, the interferometer systems described with reference to FIGS. 1–4 and to be further described hereinafter may be used.

Since only the relative position of the mask is measured relative to the substrate, a special procedure must be used when introducing the mask and the substrate into the lithorgraphic apparatus. It will be explained with reference to FIG. 6 how the introduction procedure may be performed. First, the mask table MT and the substrate table WT are brought to zero, or reset, positions which are fixed by means of stops, for example in the form of Tesa feelers.

The interferometers are set to zero.

Subsequently, the mask table is arranged above the projection lens system by means of the scanning servoloop. Due to the coupling via the differential interferometer system, the substrate table follows this movement.

Then, the mask MA, which has alignment marks $M_1$ and $M_2$, is placed in the holder of the mask table.

Subsequently, the mask is retained and the substrate table is brought to a position where a substrate is placed in the holder of the mask table.

The substrate table is then again displaced in such a way that the substrate is brought under the mask and the projection lens system.

Figure 6:
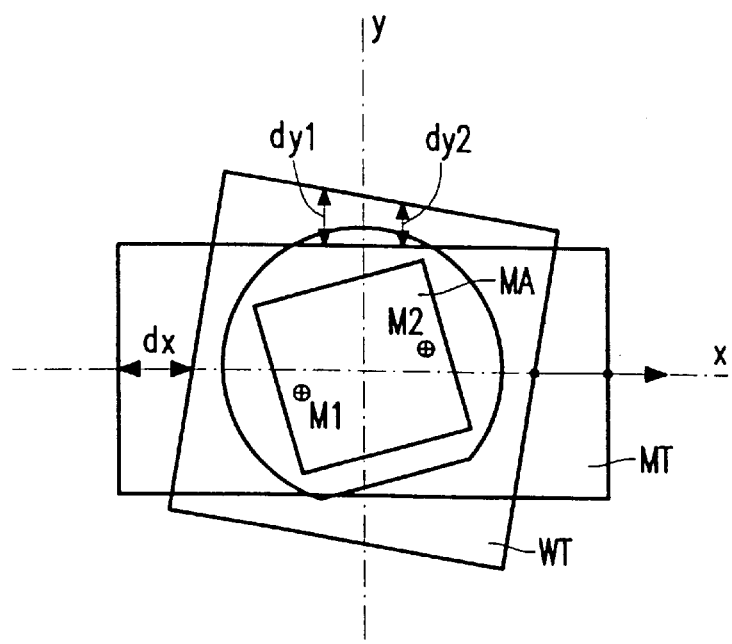
FIG. 6 shows the mutual position of a mask and a substrate after they have been aligned in the apparatus.

Subsequently, the substrate is aligned with respect to the mask by the alignment system present in the apparatus, in which the mask marks $M_1$, $M_2$ and similar alignment marks in the substrate are imaged on each other and in which it is determined whether these marks are positioned correctly with respect to each other. At that instant, the situation shown in FIG. 6 is achieved.

The X and Y positions of the substrate marks with respect to a two-dimensional system of coordinates, fixed by the X and Y interferometers, are then also known. This system of coordinates is further used during the stepping movements of the substrate table, i.e. the movements which this table must perform to bring a complete IC area under the mask and the projection lens system after the mask pattern has been imaged in one IC area (die) of the substrate.

After the substrate and the mask have been aligned with respect to each other, the substrate table performs a first stepping movement so that a first IC area is brought under the mask, while maintaining the found $dy_1$–$dy_2$ value, i.e. the $\phi_2$ value.

Subsequently, the mask and the substrate perform a synchronous movement while the projection beam is switched on, taking the magnification with respect to the projection lens system and the projection beam into account, i.e. the scanning movement, by which the mask is imaged on the first IC area. When this imaging operation has been completed, the projection beam is switched off and the substrate table moves one step so that a subsequent IC area of the substrate is placed under the mask. Then a scanning movement follows again, so that the mask pattern is imaged on the second IC area. This step-and-scan procedure continues until an image of the mask pattern has been formed in all IC areas of the substrate.

Figure 7:
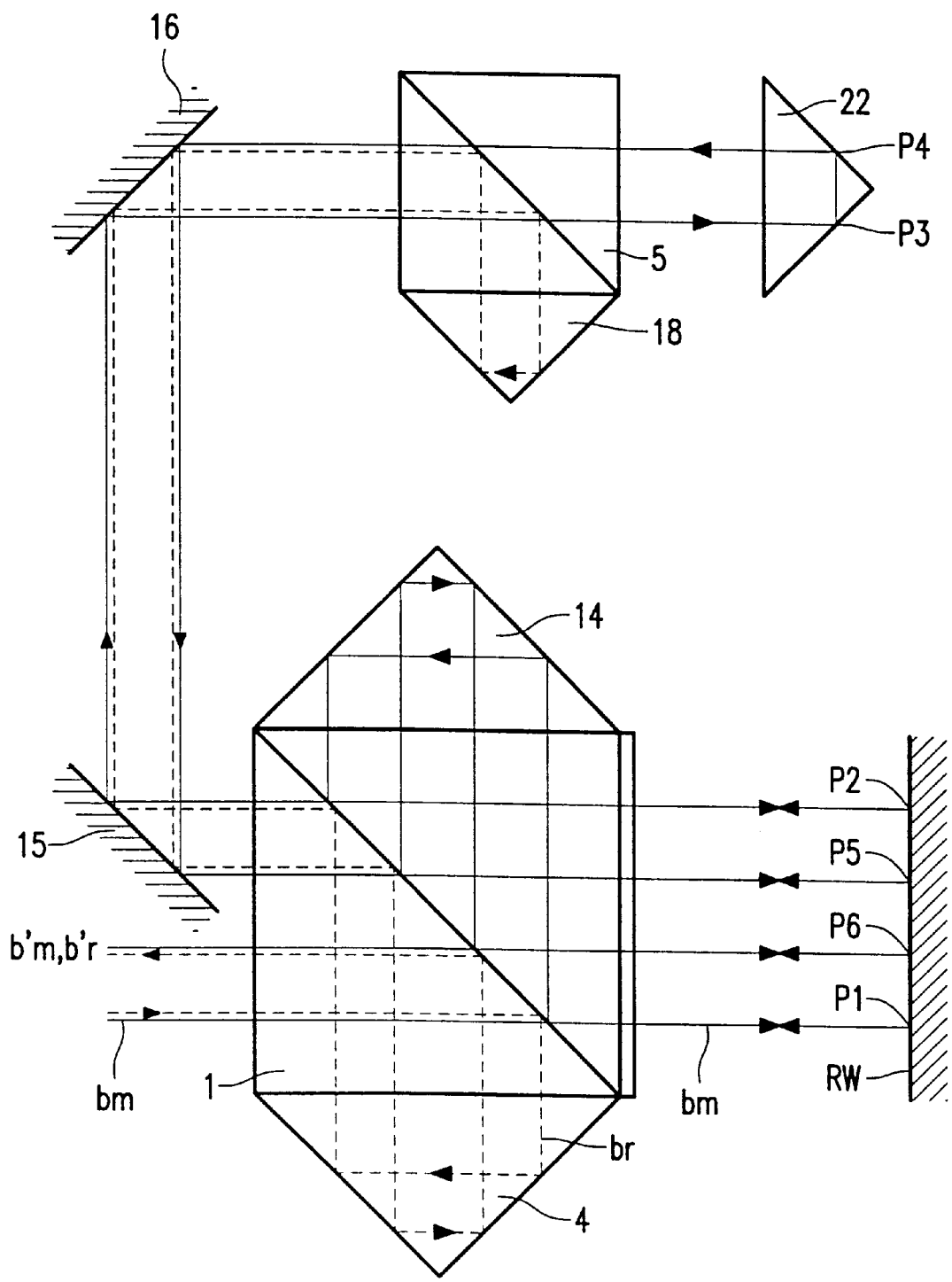
FIG. 7 shows an alternative to the embodiment shown in FIG. 2.

The relative positions: dx, $dy_1$ and $dy_2$ in FIG. 6 may be measured with the differential interferometer systems shown in FIGS. 1–4. A simpler embodiment of such an interferometer system is shown in FIG. 7. This system resembles that of FIG. 2 but has the difference that a retroreflector 22 is arranged on the mask holder or on the mask table and that the $\lambda/4$ plate 8 and the retroreflector 19 are absent.

Similarly as in the embodiment of FIG. 2, the incoming measuring beam $b_m$ in the embodiment of FIG. 7 impinges upon the substrate reflector RW first at the position P1 and then at the position P2 and subsequently crosses over to the mask via the reflectors 15 and 16. There, it impinges upon the mask reflector constituted by the retroreflector 22, consecutively at the positions P3 and P4. The measuring beam reflected at these positions is passed, similarly as in FIG. 2, consecutively to the positions P5 and P5 of the substrate reflector RW and is finally reflected as measuring beam b'$_m$ from the system. The reference beam b, travels the same path as in FIG. 2.

The interferometer systems described consist of two interferometer units which are arranged in series. In the systems shown in FIGS. 1, 2 and 7, the distance to the substrate reflector RW in one interferometer unit is traversed eight times and the distance to the mask reflector in the other unit is traversed twice. The result is that the measurement of the substrate position is four times as sensitive as the measurement of the mask position. Since the measuring beam and the reference beam travel the same path between the substrate interferometer and the mask interferometer, the measurement is insensitive to, for example, air turbulences and other irregularities. In principle, a large number of sensitivities related to the magnification of the projection lens system can be realized by choosing the correct combinations of interferometer units.

If the mask and the substrate exhibit the desired synchronous movement during scanning in the X direction in a lithographic apparatus having a magnification M, then the condition:

$$X_M + \frac{1}{M}X_W = \text{constant} \qquad (1)$$

is satisfied, in which $X_M$ and $X_W$ are the X positions of the mask and the substrate, respectively. Then the optical path length for the measuring beam b$_m$ remains constant and the detector for the measuring beam b'$_m$ will not detect any frequency shift. This means that the measuring frequency will always be equal to the frequency of the radiation source supplying the measuring beam, for example, equal to the Zeeman frequency, if use is made of a Zeeman laser which is a frequently used radiation source in interferometers. During scanning, the measuring frequency is then independent of the speeds of the mask and the substrate. In fact, the X positions of the mask and the substrate are now added optically and no longer electronically, as is done when two separate interferometers are used. Problems due to delay time differences in the detector signal processing electronics and occurring when separate interferometers are used can thus be prevented.

The + sign in the condition (1) applies to the embodiments of FIGS. 1–4 and 7 in which the measuring beam comes in contact with the substrate reflector RW as well as the mask reflector RM. If the measuring beam only measures the position of one of the reflectors, substrate reflector and mask reflector, and if the reference beam measures the position of the other one of these reflectors, then the + sign in the condition (1) should be replaced by the − sign.

The embodiments shown in FIG. 7, with a retroreflector on the mask holder, is insensitive to tilts of this holder. In this embodiment, however, the holder cannot be moved during measurement in a direction perpendicular to the measuring direction. Such a perpendicular direction is necessary, for example, if two opposed measurement in the X direction must be performed for forming a mask pattern image on an IC area, between which movements a displacement of the mask and the substrate in the Y direction is necessary. In the embodiments shown in FIGS. 1–4, in which the mask reflector is a flat reflector, the mask can be moved perpendicularly to the measuring direction.

Since substrates may have a wedge shape to a slight extent in practice, and since these substrates are laid with their rear side on the substrate holder, it may be necessary to tilt the substrate holder about the X and/or Y axis. However, the interferometer measurements may then be affected by Abbe errors. To compensate for these errors, it is necessary that this (these) tilt(s) can be measured. As described in EP Patent Application 0 498 499, an interferometer system, which is extended in such a way that it has five measuring axes, provides the possibility of measuring these tilts. When a differential interferometer system is used in a lithographic projection apparatus, it may be easier to use separate interferometers for these tilt measurements. Such an interferometer should be sensitive to the tilt, but not to the position, of the substrate holder.

Figure 8:
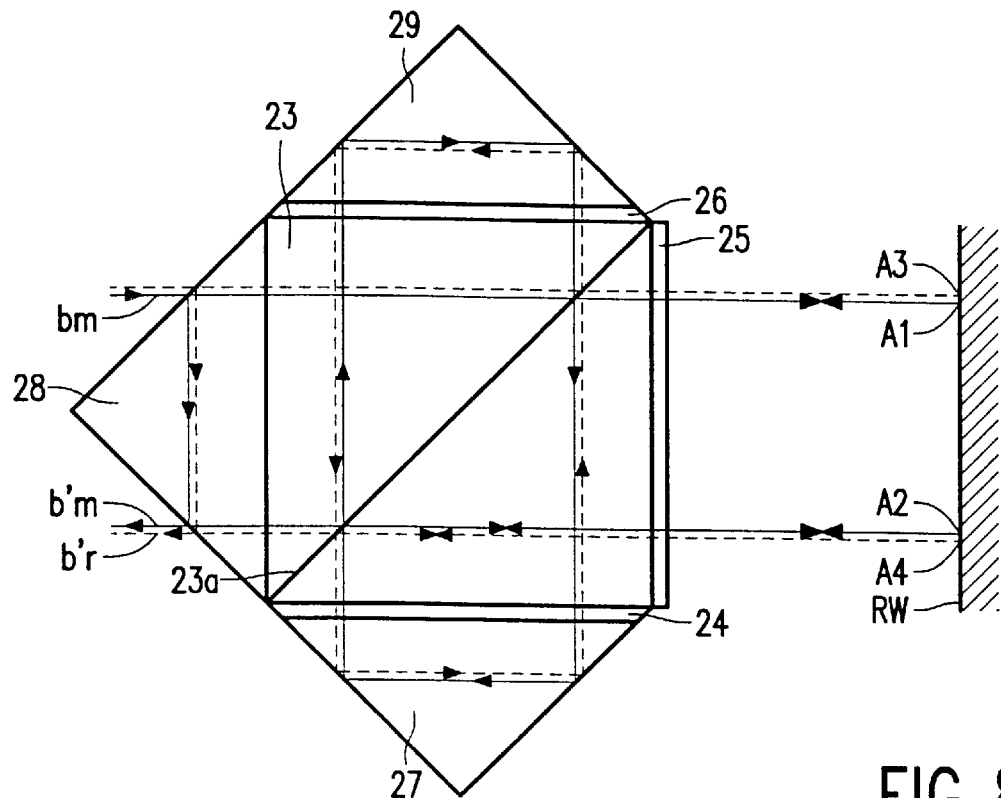
FIGS. 8 and 9 show embodiments of special interferometers for measuring the tilt of a substrate holder.

FIG. 8 shows a first embodiment of such an interferometer for measuring the tilt of the substrate about the Y axis. This interferometer comprises a polarization-sensitive beam splitter 23 around which three λ/4 plates 24, 25 and 26 are arranged. Furthermore, the interferometer comprises a retroreflector 29 and two reflecting prisms 28 and 27. The measuring beam b$_m$ entering from the left impinges upon the substrate reflector RW at the position A1 and is subsequently reflected by the interface 23a of the beam splitter to the prism 27. This prism sends the measuring beam b$_m$ via reflections on its oblique sides to the retroreflector 29 which reflects the beam to the interface 23a again. This interface now reflects the measuring beam to the prism 28. The oblique sides of this prism subsequently reflect the measuring beam to the interface 23a which reflects the measuring beam to the retroreflector 29 again. This reflector sends the measuring beam back to the prism 27 which reflects the beam to the interface 23a. This interface now reflects the measuring beam to the substrate reflector RW where the measuring beam is incident at the position A2. The measuring beam reflected at this position is finally passed by the interface 23a so that it can reach a detector (not shown).

The reference beam b$_r$ is first reflected by the interface 23a to the retroreflector 29, subsequently by this retroreflector to the prism 27, then by this prism to the interface and by this interface to the position A3 on the substrate reflector. The reference beam reflected at this position is again sent by the prism 28 to the substrate reflector RW where it is incident on the position A4. The reference beam reflected at this position is reflected by the interface 23a to the prism 27, subsequently by this prism to the retroreflector 29 and then by this reflector to the interface again. This interface finally reflects the reference beam b'$_r$ to the detector.

In the interferometer of FIG. 8, both the measuring beam b$_m$ and the reference beam b$_r$ measuring the X position of the substrate reflector RW. This measurement is, however, performed at two different positions: A1, A3 and A2, A4. Consequently, the interferometer is only sensitive to the difference in the X distances of these two positions to the stationary elements of the interferometer and not to the X distance of this reflector.

Figure 9:
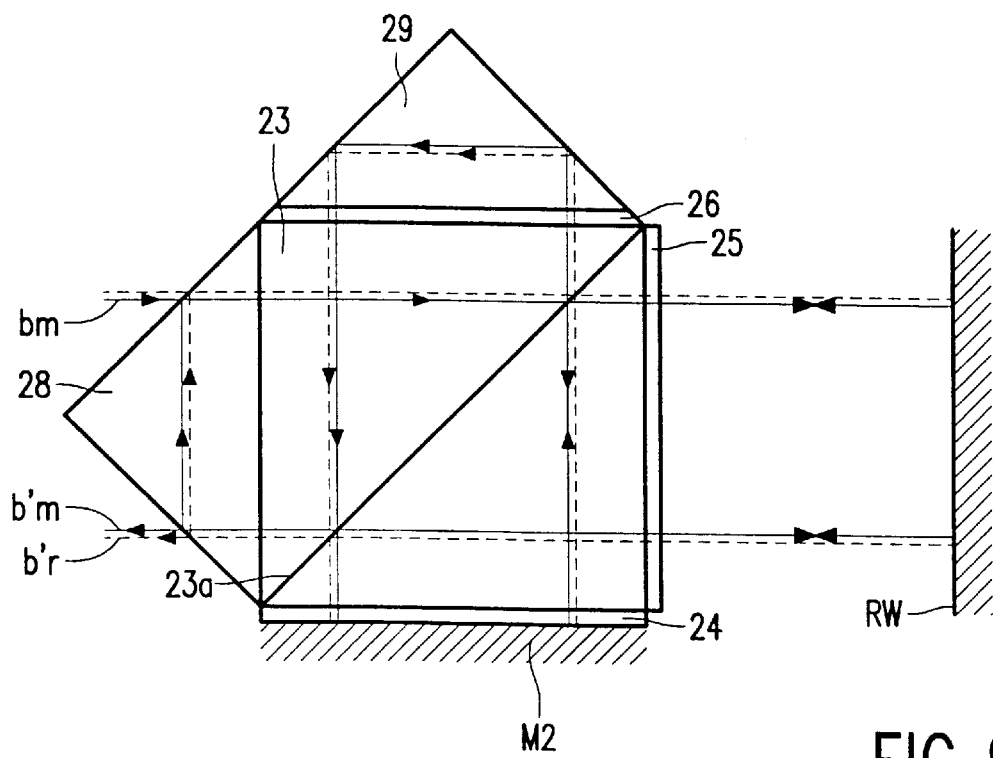

FIG. 9 shows a second embodiment of an interferometer for measuring the tilt $\phi_y$ of the substrate reflector RW about the Y axis. This embodiment differs from that of FIG. 8 in that the reflecting prism 27 is replaced by a flat reflector M2. This reflector reflects the perpendicularly incident measuring beam b$_m$ and reference beam b$_r$ in itself. The sequence in which the measuring beam and the reference beam in FIG. 9 come in contact with the substrate reflector RW, the reflector M2, the retroreflector 29 and the prism 28 is the same as that in which these beams come in contact with the substrate reflector, the prism 27, the retroreflector 29 and the prism 28 in FIG. 8.

The differential interferometer system for use in a lithographic projection apparatus may be further improved by taking measures to prevent possible instabilities in the apparatus from affecting the measurement of the mutual position of the mask and the substrate. To this end, the influence of the position and tilt of the projection lens system, hereinafter referred to as projection lens for short, must be eliminated.

Figure 10:
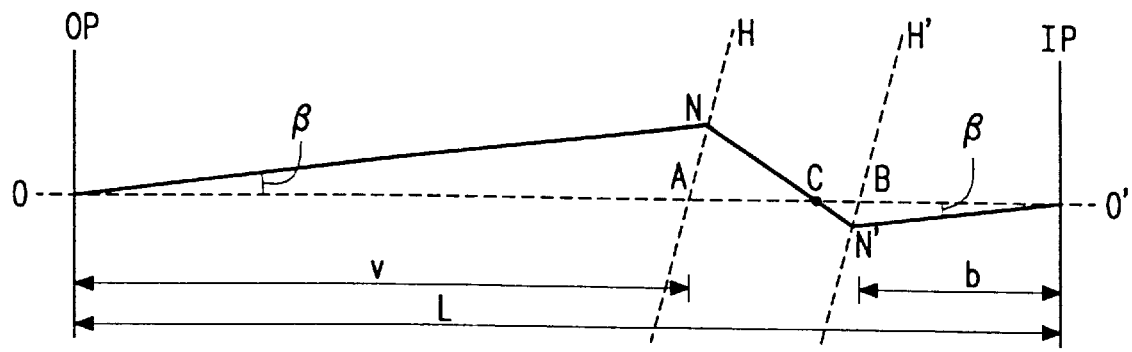
FIG. 10 shows the computation of the point of a projection lens around which this lens can be titled without offsetting the image.

For this projection lens, a point can be indicated around which the lens can be tilted without changing the position of the image formed by this lens. This is the point C in FIG. 10. In this Figure, v and b are the object length and the image length, respectively, and OP and IP are the object plane and the image plane, respectively. The point C is between the two nodes of the lens. When the medium at both sides of the lens is the same, for example air, the nodes coincide with the main points A and B of the projections lens. H and H' indicate the main faces of this lens. The lens should satisfy the condition:

$$\frac{BN'}{AN} = \frac{b}{v} = M \tag{2}$$

It follows that:

$$Bc = \frac{M}{M+1} \cdot AB \tag{3}$$

because:

$$v = \frac{f}{M} + f \tag{4}$$

and:

$$f \doteq f \cdot (M + f) \tag{5}$$

for the distance between the main faces:

$$AB = L - 2 \cdot f - M \cdot f = \frac{f}{M} \tag{6}$$

and:

$$OC = \frac{M}{M+1} \cdot L \tag{7}$$

This shows that the position of the point C is independent of all kinds of lens parameters such as the focal length and the positions of the main faces, but is only influenced by the magnification and the distance between the object plane and the image plane. This means that the position of the point C is the same for substantially all projections lenses.

For current used projection lenses in a stepping lithographic projection apparatus having, for example, a magnification M=0.2 and an object-image length L=600 mm, OC=100 mm.

A possible projection lens for a step-and-scan apparatus could have, for example a magnification M=0.25 and an object-image length L=120 mm. For such a lens, OC=120 mm.

If the position of the projection lens is to be measured in order to be able to correct its influence on the position of the image formed by this lens, it is preferred to perform the projection lens position measurement at the location of the point C. In fact, the measurement is then insensitive to a tilt of the projection lens.

Figure 11:
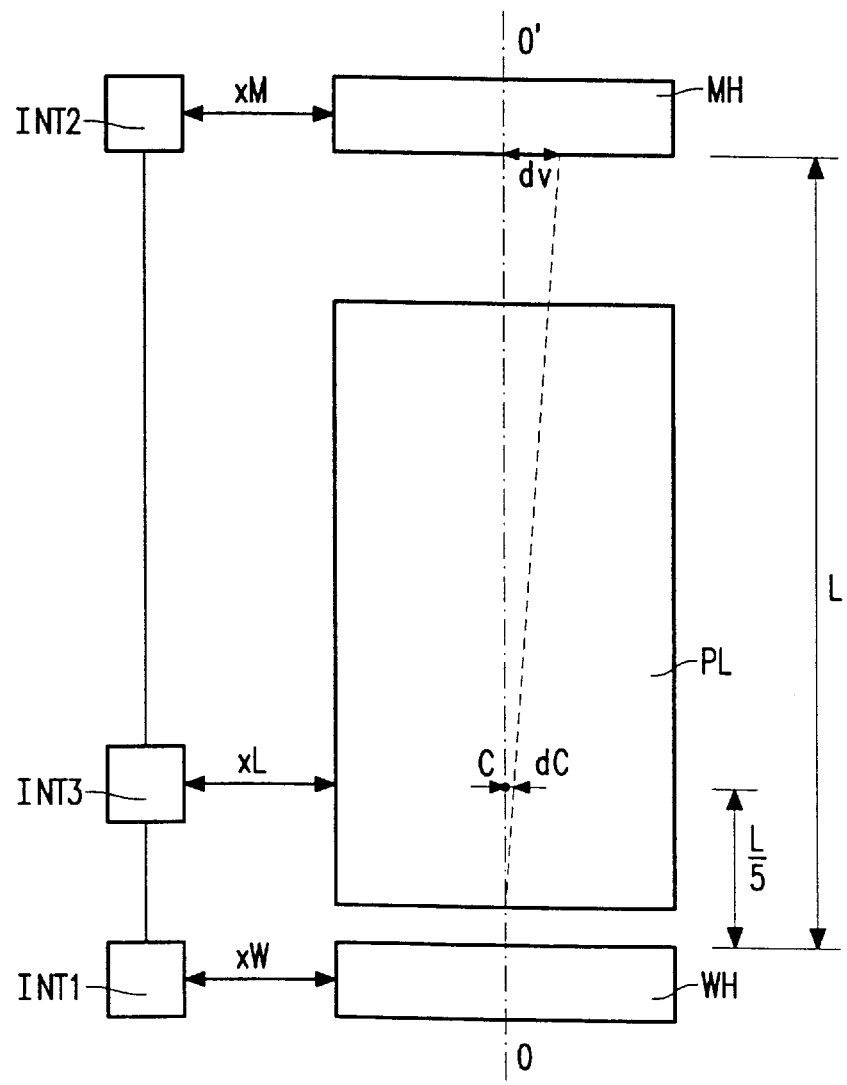
FIG. 11 shows an interferometer system with a separate measurement of the position of the projection lens.

With reference to FIG. 11, the result can be shown of a horizontal displacement dC, for example in the X direction, of the projection lens. This Figure shows the mask holder MH, the projection lens PL and the substrate holder WH. The X positions of these components are denoted by $X_M$, $X_L$ and $X_W$, respectively. INT1, INT2 and INT3 are interferometers which may be used for measuring the positions of the substrate, the mask and the projection lens. For the relation between the displacement dC of the lens and the imaginary displacement dV of the object, i.e. the mask, it hold that:

$$\frac{dV}{dC} = \frac{L}{OC} = \frac{M+1}{M} \tag{8}$$

and for the displacement dB of the image of the mask pattern on the substrate:

$$dB = M \cdot dV = (M+1) \cdot dC \tag{9}$$

If, for example, the magnification M=0.25, it follows from (8) that:

$$dV = 5 \cdot dC \tag{10}$$

This means that the position of the projection lens can be measured with a five times greater sensitivity than the position of the mask. To eliminate the influence of the lens position when the mask is well positioned with respect to the substrate, the following condition should be satisfied for the example given:

$$X_M + 4X_W - 5X_L = \text{constant} \tag{11}$$

or more generally:

$$X_M + \frac{1}{M} \cdot (X_W - (M+1) \cdot X_L) = \text{constant} \tag{12}$$

This five times greater measuring sensitivity to the lens position can be obtained by adding the sensitivity of the substrate measurement and that of the mask measurement, which means that the interferometers INT1 and INT2 must be placed in series.

Figure 12:
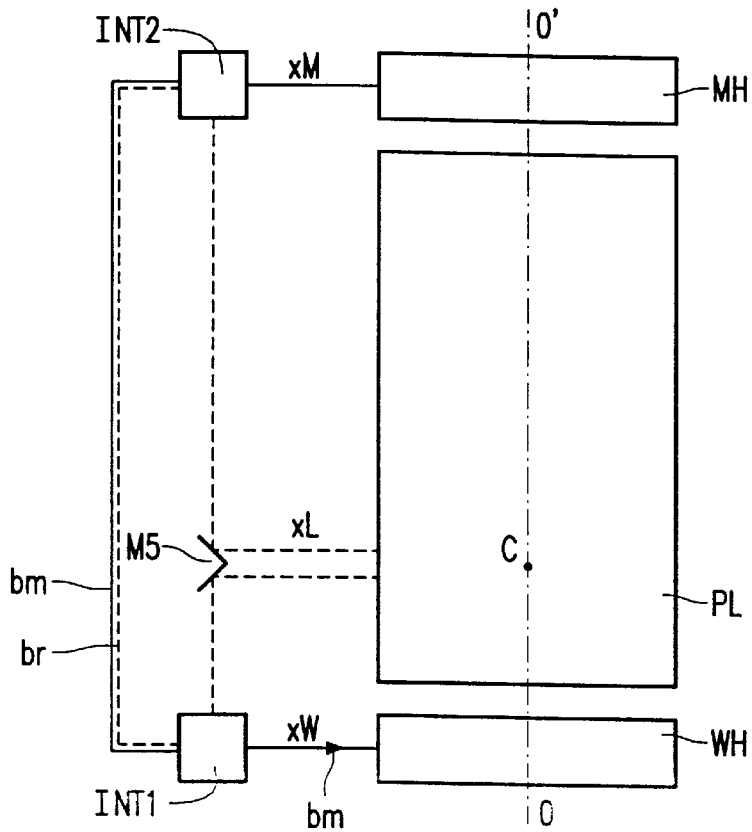
FIG. 12 shows a differential interferometer system in which the measurement, at one point, of the position of the projection lens is integrated.

An interferometer system, in which this is the case, is shown diagrammatically in FIG. 12. In this Figure, similarly as in the foregoing and subsequent Figures, the measuring beam $b_m$ is denoted by a solid line and the reference beam $b_r$ is denoted by a broken line. The − sign in the equations (11) and (12) applies if the reference beam $b_r$ is used for measuring the projection lens position $X_L$. To this end, the system shown in FIG. 12 is provided with an extra reflector $M_5$. The measuring beam $b_m$ is used for measuring the mutual position of the mask and the substrate. In the system of FIG. 12, the position of the mask, $X_M$, is measured twice, that of the substrate, $X_W$, is measured eight time and that of the projection lens, $X_L$, is measured ten times. Since the paths for the measuring beam and the reference beam are partly different, it should be ensured that no air turbulences and other irregularities can occur in the radiation paths.

Figure 13:
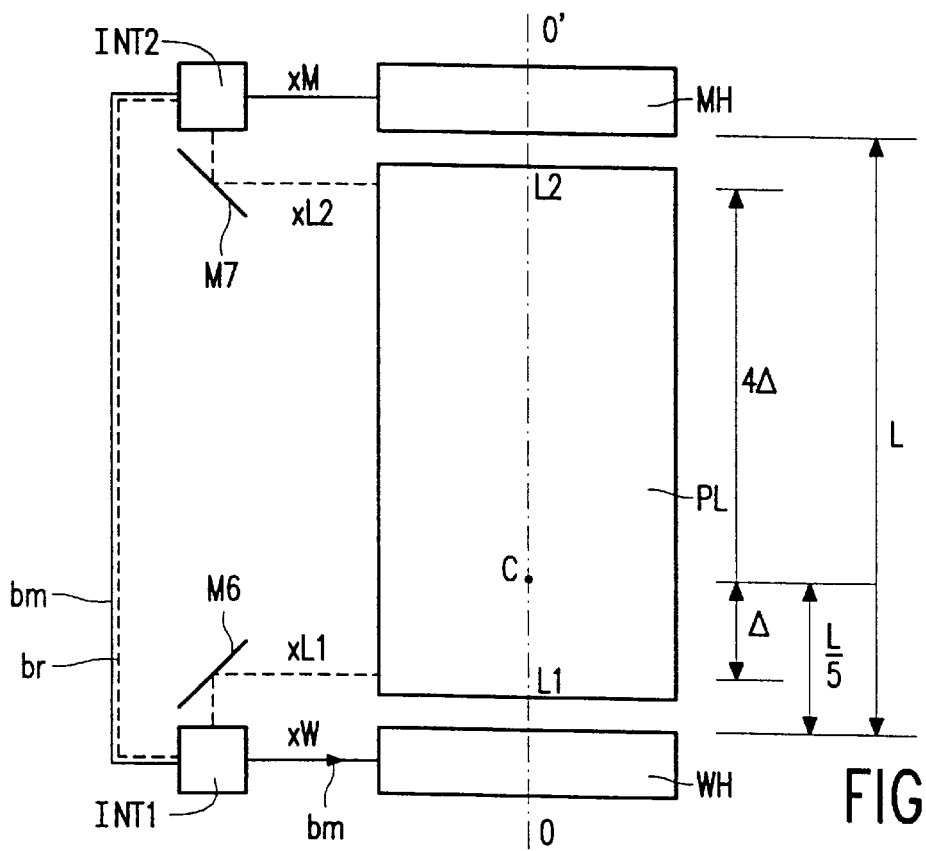
FIG. 13 shows a differential interferometer system in which the measurement, at two points, of the position of the projection lens is integrated.

An interferometer system which is insensitive to air turbulences and the like is shown diagrammatically in FIG. 13. In this system, the measurement of the projection lens position is split up into two measurements of the lens position at different heights. A first lens position measurement is performed in the proximity of the mask, which measurement has the sensitivity of the mask position measurement. The second lens position measurement is performed in the proximity of the substrate, which measurement has the sensitivity of the substrate position measurement. The condition now is that the distances between the respective measurement positions $X_{L,2}$ and $X_{L,1}$ and the point C are in the same ratio as the magnification M of the projection lens. For synchronously moving the mask and the substrate during the imaging scanning movement, the following condition should now be satisfied:

$$X_M + 4 \cdot X_W - 4 \cdot X_{L,1} - X_{L,2} = \text{constant} \tag{13}$$

if the magnification M of the projection lens is 0.25. With this condition, the point where the mask position is measured and the upper point where the lens position is measured are tied together. The same applies to the point where the substrate position is measured and the lower point where the lens position is measured.

The advantages of the interferometer system of FIG. 13 are:
 there is a compensation for both the displacement and the tilt of the projection lens;
 the measurement is insensitive to irregularities in the radiation path between INT1 and INT2;
 the positions of INT1 and INT2 are unimportant, so the measurement is insensitive to vibrations and instabilities in the apparatus. Only a tilt of INT1 and INT2 could be of influence. To eliminate this influence, $5 \cdot \Delta$ should preferably be equal to L.

An important condition for accurately measuring the positions of the substrate and the mask, hence of dX, $dY_1$ and $dY_2$, is that these measurements are not affected by rotations about the Z axis and tilts about the X axis and Y axis. In order that no extreme requirements have to be imposed on the bearing of the substrate and the mask, it is preferred to render the differential interferometers themselves insensitive to this rotation and tilts. If the mask holder moves in the X direction only and is fixed in the other directions by means of air bearings, the rotation $\phi_z$ of the substrate holder is initially important.

Figure 14:
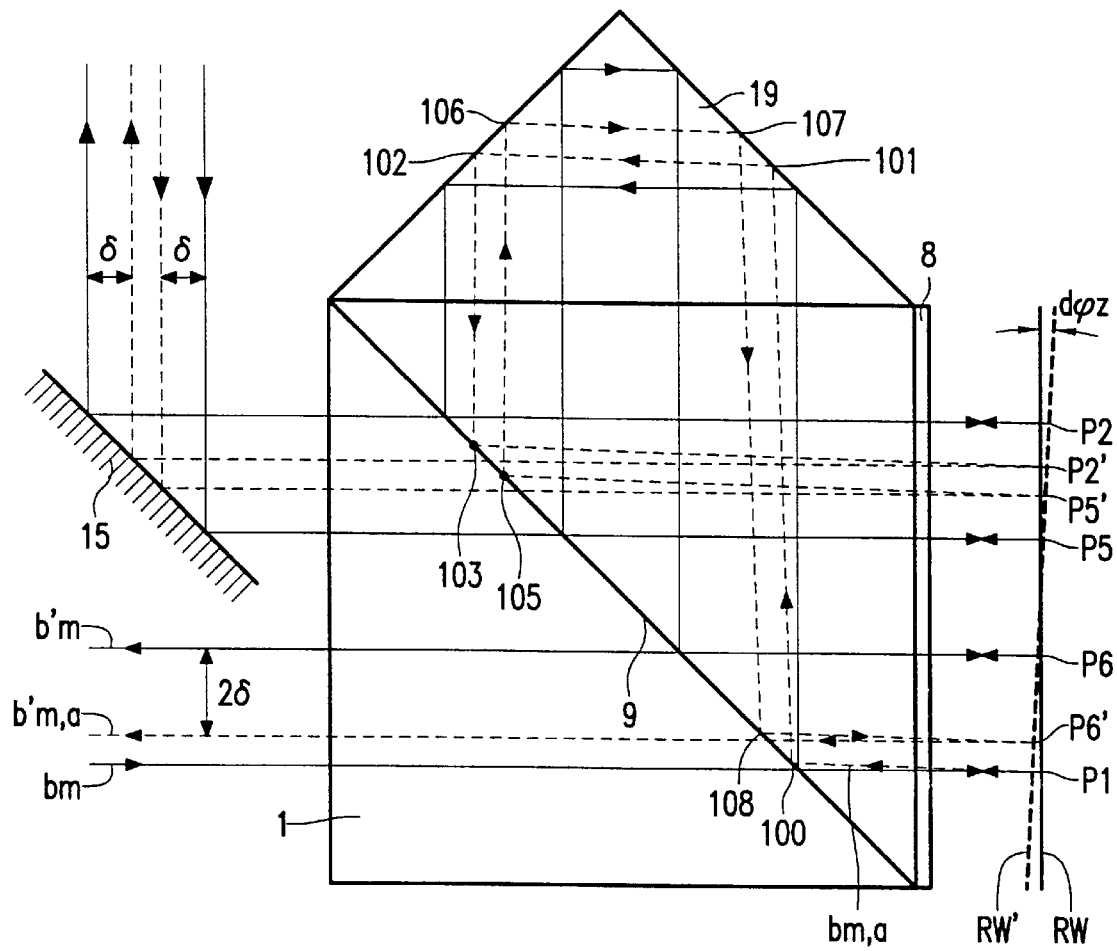
FIG. 14 shows the mutual offset of a measuring beam and a reference bean upon a rotation of the substrate holder.

FIG. 14 illustrates the effect of a rotation $\phi_2$ of the substrate about the Z axis. This Figure shows the elements of the lower part of FIG. 2. As has been described with reference to FIG. 2, the measuring beam $b_m$ is first reflected twice by the substrate reflector RW at the positions P1 and P2, subsequently crosses over to the mask reflector RM where it is reflected, then returns to the substrate reflector so as to be reflected consecutively at the positions P3 and P4 and is passes as beam $b'_m$ to the detector (not shown). This is the situation when the measuring beam is perpendicularly incident on the substrate reflector, hence when $\phi_z = 0$. This measuring beam is denoted by $b_m$. When $\phi_2$ is unequal to zero, the measuring beam traverse the path denoted by the broken lines. The measuring beam is then first reflected at the position P1 again, but no longer perpendicularly. This measuring beam is denoted by $b_{m,a}$. Via reflections at the points 100–103 of the interface 9 of the beam splitter 1 and of the retroreflector 19, the beam $b_{m,a}$ is sent towards the position P2' of the substrate reflector. The beam $b_{m,a}$ reflected there is then parallel again to the beam $b_m$ and hence also to the reference beam (not shown in FIG. 14), but offset through a distance $\delta$. On its way to and from the mask reflector, there is no further offset between the measuring beam $b_{m,a}$ and the reference beam. As can be deduced from FIG. 2, the offset between the measuring beam $b_{m,a}$ from the mask reflector and the reference beam is point-mirrored with respect to this offset between the measuring beam $b_{m,a}$ going to the mask reflector and the reference beam. The measuring beam $b_{m,a}$ coming from the mask reflector impinges upon the substrate reflector first to the position P5'. The measuring beam reflected there is then passed to the position P6' via reflections on the points 105–108 and at this position it is reflected as beam $b'_{m,a}$ to the detector. Upon the second passage of the measuring beam $b_{m,a}$ through the substrate interferometer, the offset between the measuring beam and the reference beam is doubled. Due to its twice greater sensitivity, the differential interferometer is also twice as sensitive to rotation of the substrate.

Due to the offset $2\delta$ between the measuring beam and the reference beam, the overlap between the measuring beam and the reference beam becomes smaller at the location of the detector, so that the signal, which is representative of the mutual position of the substrate reflector and the mask reflector, becomes smaller. When a standard interferometer is used, in which the beams have a diameter of, for example 5 mm, this means for, for example the substrate reflector that it may tilt at most plus or minus 2 mrad. This margin could be increased by increasing the diameters of the beam. However, an extra beam-widening optical system is required for this purpose. But it is an even greater drawback that the optical components must be increased in order that vignetting of the beams on these components will not occur. Since these components must have a very good optical quality, they will them become very expensive. As will be explained, the detrimental effect of a measuring reflector rotation or tilt, or the angle sensitivity of the differential interferometer can be eliminated in accordance with a further aspect of the invention.

Figure 15:
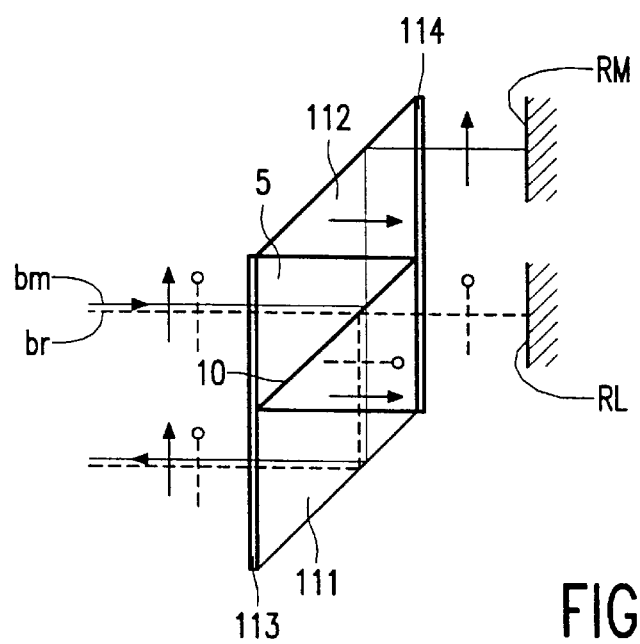
FIGS. 15 and 16 show special reflector units which can be placed near a mask interferometer so as to eliminate the effect of this offset.
Figure 16:
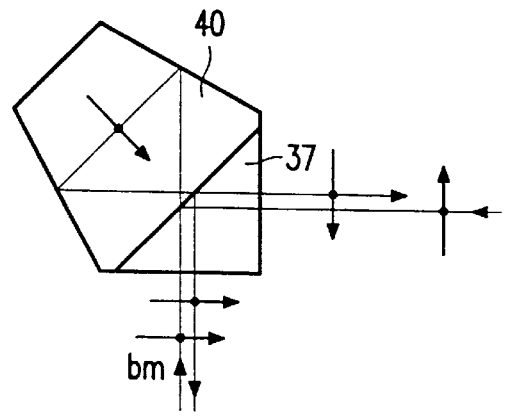

To this end, the mirror symmetry of the mask interferometer may be adapted as is illustrated in FIGS. 15 and 16. FIG. 15 shows the mask interferometer, hence the part of the differential interferometer which is situated in the proximity of the mask reflector RM and the projection lens reflector RL which is used in the embodiment of FIG. 13. The mask interferometer comprises a polarization-sensitive beam splitter 5 with an interface 10, two reflecting prisms 111 and 112 and two $\lambda/4$ plates 113 and 114. The measuring beam $b_m$, going to the mask reflector, and the reference beam $b_r$, going to the lens reflector RL2, are denoted by solid lines and broken lines, respectively. In this Figure and the subsequent Figures, arrows at right angles to the measuring beam and broken lines at right angles to the reference beam indicate how these beams are mirrored upon their passage through the interferometer. In FIG. 15, the measuring beam $b_m$ is reflected five times and the reference beam is reflected three times, which means that they mutually maintain the same orientation and that a possible offset between the incoming beams is maintained and is not mirrored.

As has been described hereinbefore, the measuring beam $b_m$ and the reference beam $b_r$ coming from the mask interferometer traverse the substrate interferometer a second time. When, upon the first passage through the substrate interferometer, a first offset has occurred between the measuring beam and the reference beam, a second, similar offset will occur upon the second passage through the substrate interferometer. Since the first offset upon passage the mask interferometer does not change, said second offset will compensate said first offset.

The solution to the problem of rotation and tilt sensitivity of the differential interferometer, which solution consists of an odd number of reflections in the mask interferometer, may be alternatively realized by arranging a special reflector unit between the substrate interferometer and the mask interferometer. An embodiment of this reflector unit is shown in FIG. 16. This unit, which may be arranged, for example at the position of the reflector 16 in FIG. 2, consists of a prism 37 and a penta-prism 40. The incoming measuring beam $b_m$ traverses the prism 37 and is then reflected consecutively by the sides 38 and 39 of the penta-prism and subsequently passed by the prism 37 towards the mask reflector.

Figure 17:
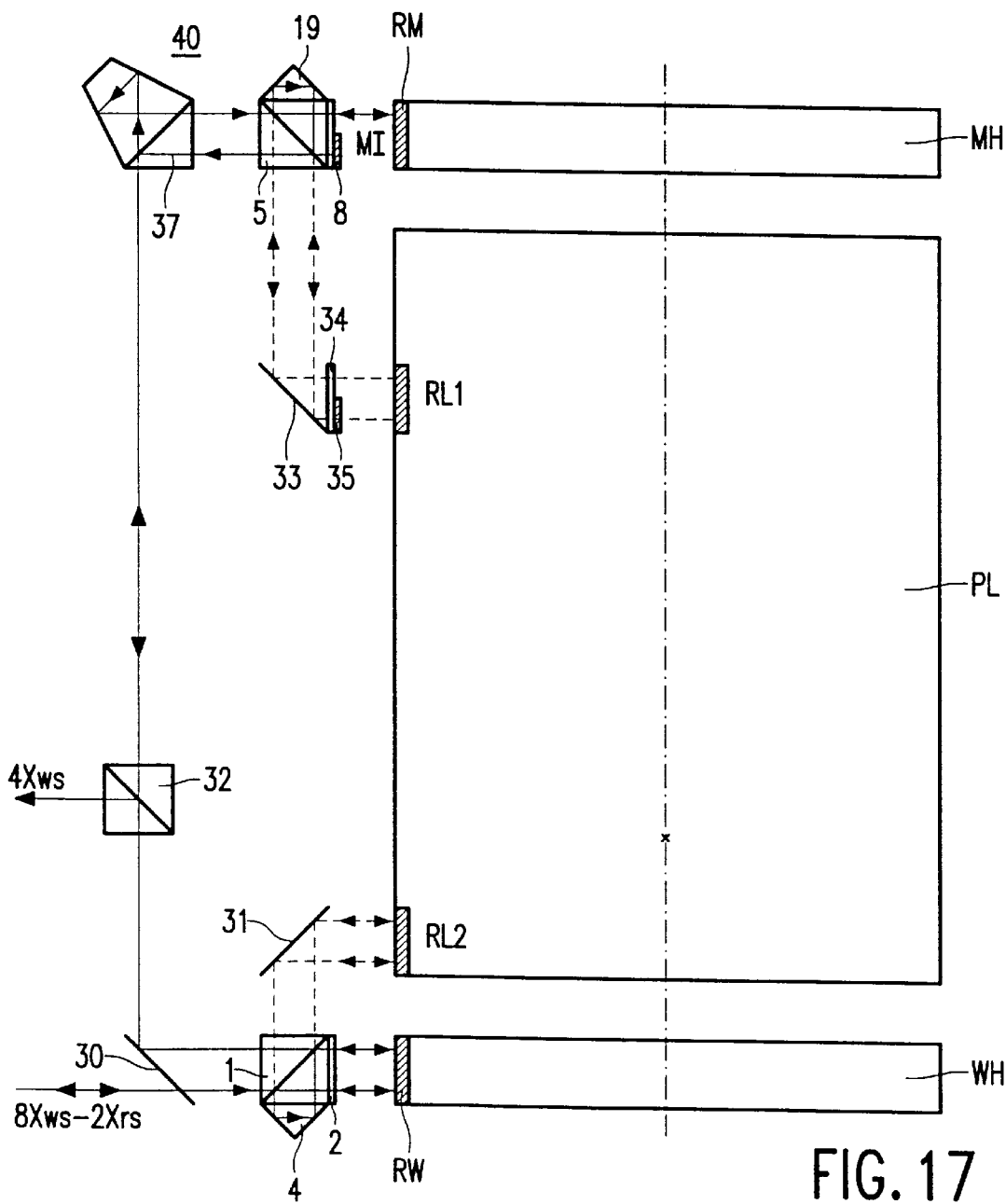
FIG. 17 shows an embodiment of a different interferometer system with a projection lens position measurement in which the effect of a rotation or tilt of the substrate holder is eliminated.

FIG. 17 shows an embodiment of the differential interferometer system in accordance with the principle of FIG. 13, in which this reflection unit is incorporated. This Figure shows a first, or substrate, interferometer unit with a polarization-sensitive beam splitter 1, a retroreflector 4 and a λ/4 plate 2, as well as a second, or mask, interferometer unit, again with a polarization-sensitive beam splitter 5, a retroreflector 19, a λ/4 plate 8 and a reflector MI. Moreover, the system of FIG. 17 comprises a splitting mirror 30 and a coupling-out prism 32. The projection lens PL of the projection apparatus with which the mask pattern is imaged on the substrate is arranged between the mask holder MH and the substrate holder WH. The projection lens is provided with two extra reflectors RL1 and RL2 which constitute the reference reflectors for the second and the first interferometer unit, respectively. A reflector 33, a λ/4 plate 35 and a reflector 35 are arranged proximate to the lens reflector RL1, and a reflector 31 is arranged proximate to the lens reflector RL2. Similarly as in the foregoing Figures, the measuring beam in FIG. 17 is also denoted by solid lines and the reference beam is denoted by broken lines. The arrows in these lines show the path followed by the measuring beam through the system via two first reflections on the substrate reflector RW, a reflection on the mask reflector RM and a reflection on the reflector MI, and the path of the reference beam through the system via two first reflections on the lens reflector RL2, a reflection on the lens reflector RL1 and a reflection on the reflector 35, and via two further reflections on the lens reflector RL2.

Figure 18:
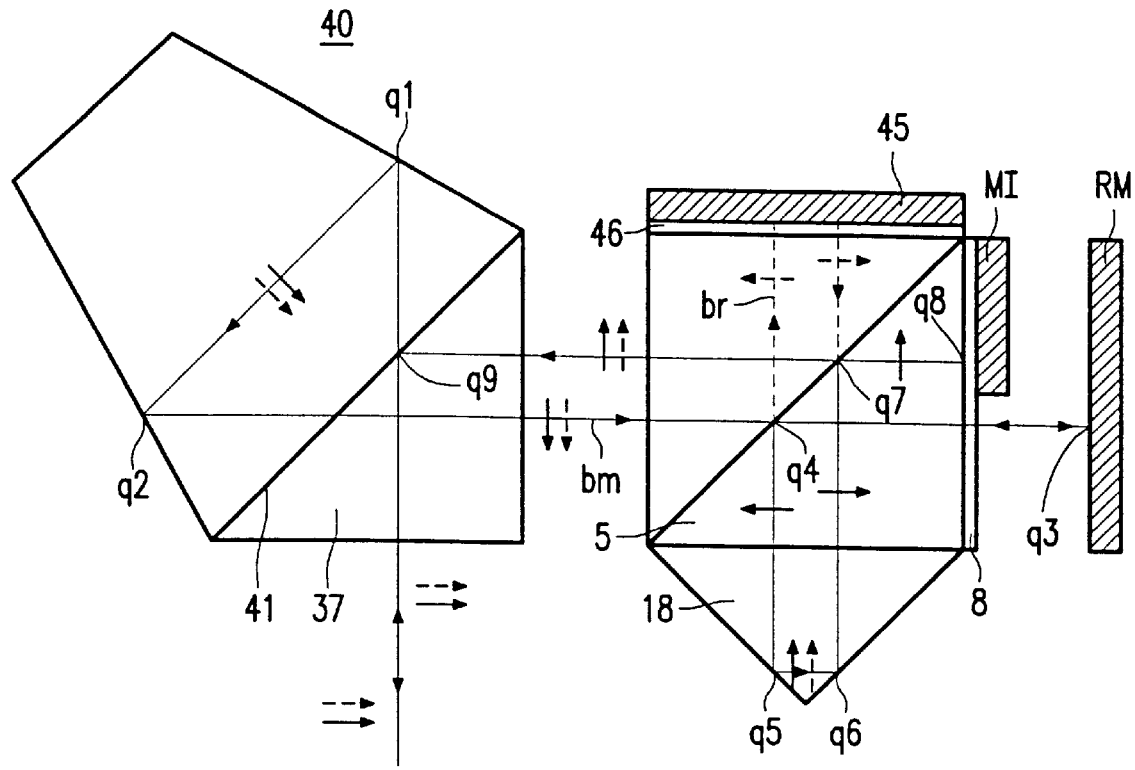
FIG. 18 shows a mask interferometer sub-system for use in this embodiment.

The reflector unit comprising the penta-prism 40 with an interface 41 and the prism 37 are arranged proximate to the mask interferometer. FIG. 18 shows how the measuring beam coming from the substrate interferometer and the reference beam pass through the sub-system consisting of the reflector unit and the second mask interferometer. This sub-system comprises a further reflector 45 and a quarter-wavelength plate 46. The arrows in the beam show the path of the measuring beam through the sub-system via reflections consecutively at the position $q_1$–$q_9$.

The sensitivity of the differential interferometer system to rotation about the Z axis of the substrate has been referred to so far. The method described above for eliminating this sensitivity may of course also be used for eliminating a possible sensitivity of the differential interferometer system to tilts about the X and/or Y axis of the substrate or of the mask.

Figure 20:
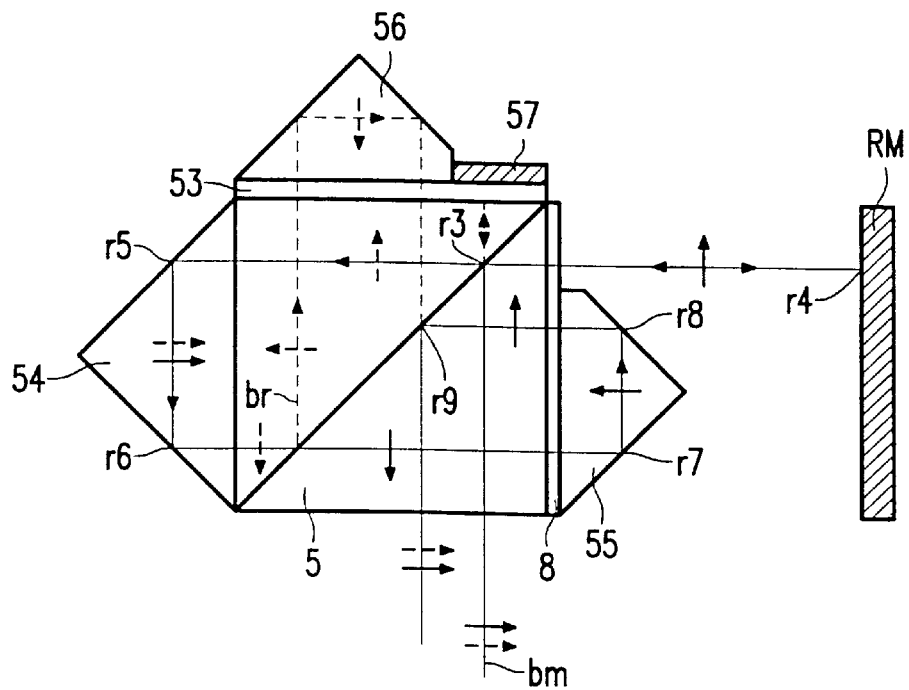
FIGS. 20–22 show different embodiments of mask interferometer sub-systems for use in the embodiment of FIG. 19.
Figure 19:
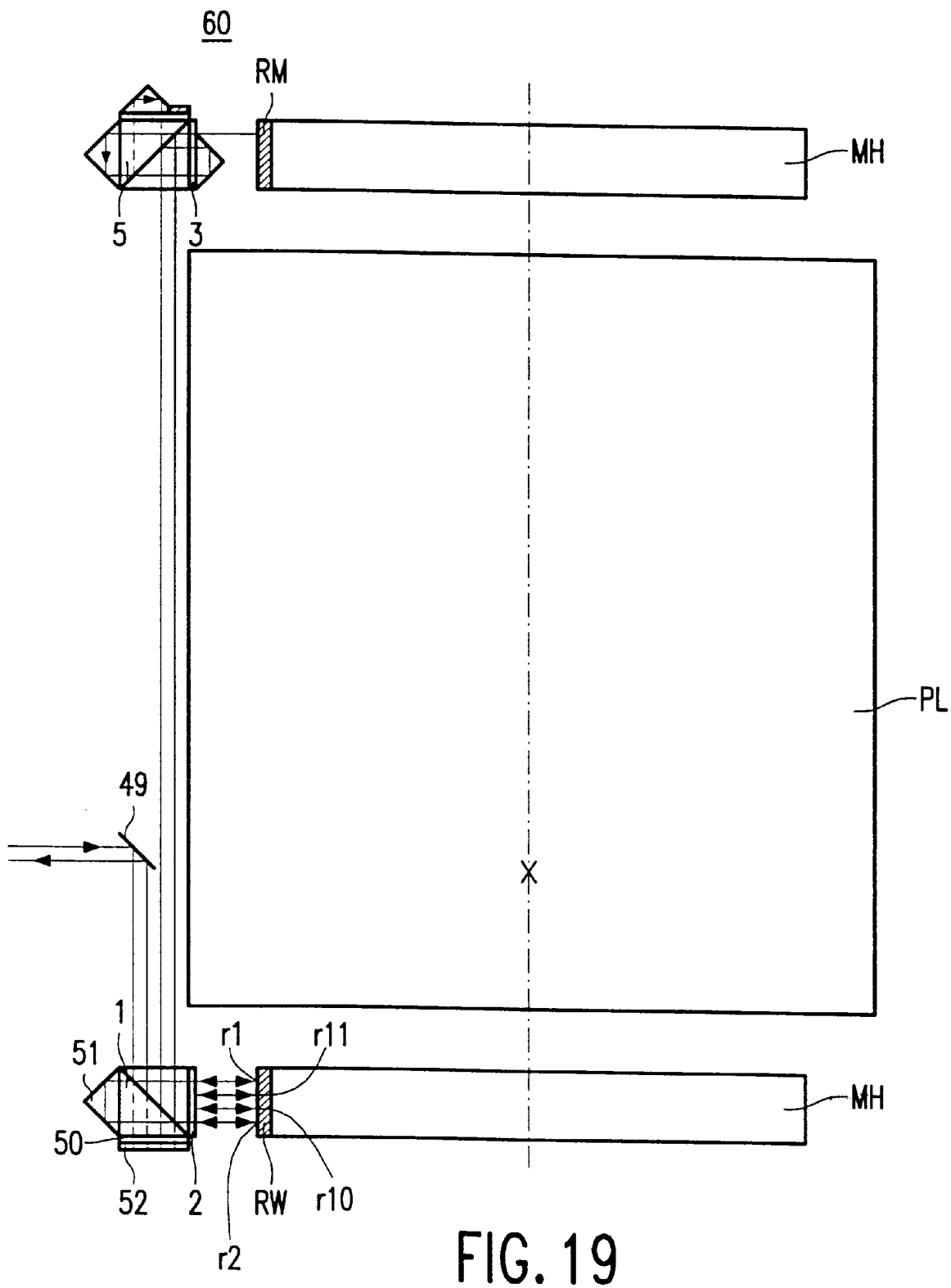
FIG. 19 shows an embodiment of a differential interferometer system in which the effect of a rotation or tilt of the substrate holder is eliminated.

FIG. 19 shows a further embodiment of a differential interferometer system for a projection apparatus having a magnification M=¼ in which a rotation or a tilt of the substrate reflector is compensated. The substrate interferometer unit not only comprises the polarization-sensitive beam splitter 1 and the λ/4 plate 2, but also a further λ/4 plate 50, a reflector 52 for the reference beam a retroreflector 51. The broken lines again show the path of the reference beam in so far as this path does not coincide with that of the measuring beam. This beam is first reflected twice by the substrate reflector RW at the positions $r_1$ and $r_2$, and the reference beam is first reflected twice on the reference reflector 52. Subsequently, these beams go to the mask interferometer unit 60 and the mask reflector RM. In FIG. 20, the mask interferometer unit 60 is shown on a larger scale. This unit not only comprises the polarization-sensitive beam splitter 5 and the λ/4 plate 8 but also a further λ/4 plate 53, a reflector 57 for the reference beam and three retroreflectors 54, 55 and 56. The arrows in the measuring beam $b_m$ and the reference beam $b_r$ show the paths of these beams through the unit. The measuring beam is reflected consecutively at the positions $r_3$–$r_9$ and then returns to the substrate interferometer unit and the substrate reflector where it is again reflected twice at the positions $r_{10}$ and $r_{11}$ before it is passed to the detector.

Figure 21:
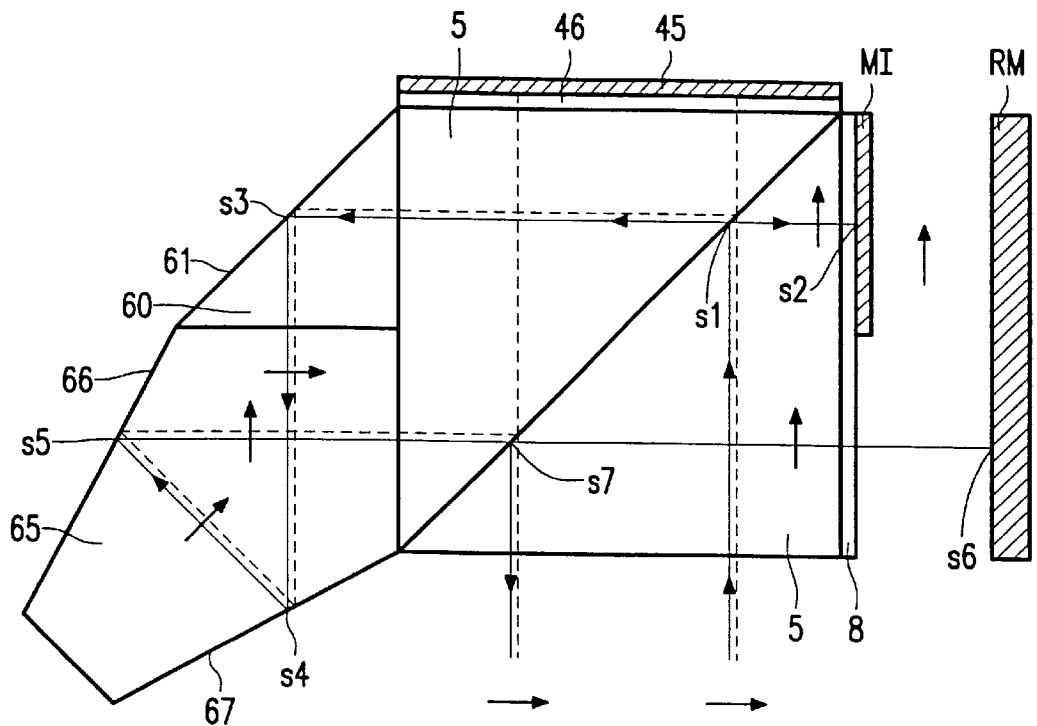

FIG. 21 shows another embodiment of a sub-system comprising the mask interferometer and a reflector unit. This unit comprises a first prism 60 having a reflecting face 61 and a second prism 65 having reflecting faces 66 and 67. By using this reflector unit, it is achieved that the measuring beam and the reference beam, upon passage through the sub-system, are not reversed, i.e. the left part and the right part of these beams are not interchanged. This is denoted by the arrows at right angles to the beams. The measuring beam, denoted by the solid lines, is reflected consecutively at the positions $s_1$–$s_7$, inter alia, once by the mask reflector RM and once by the reflector MI. Also the reference beam, denoted by the broken lines, is reflected seven times, inter alia, twice by the reflector 45.

Figure 22:
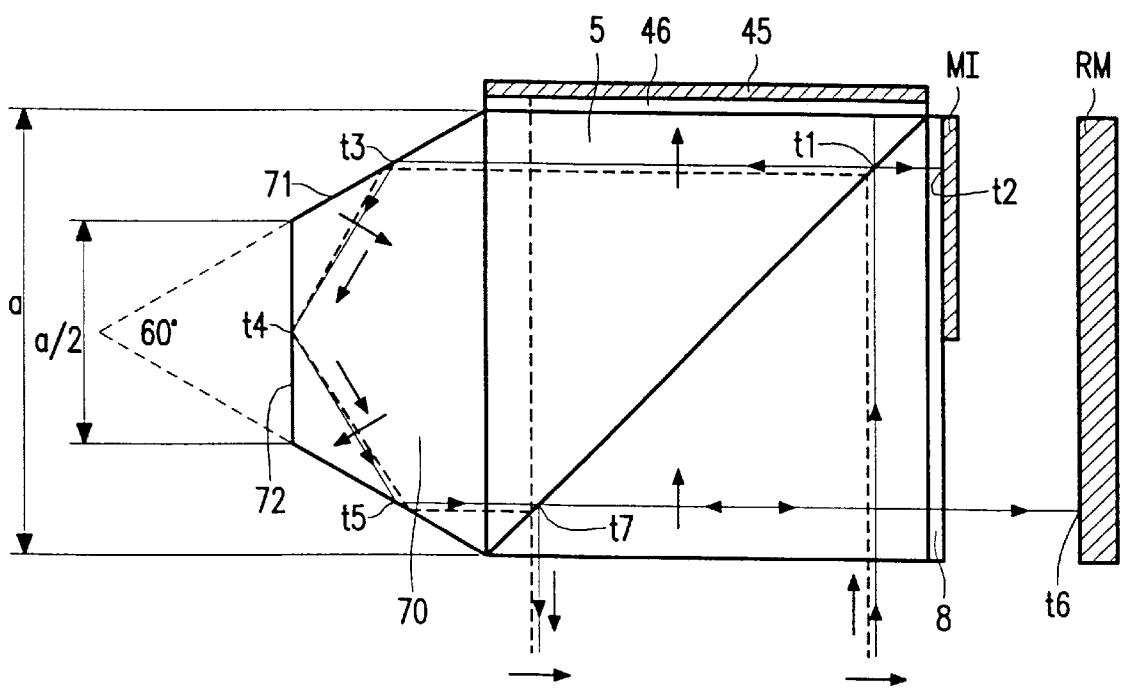

FIG. 22 shows an embodiment which is similar to that shown in FIG. 21 but in which the prisms 60 and 65 have been replaced by a trapezoidal prism 70 having reflecting faces 71, 72 and 73. Also in this embodiment, the measuring beam is reflected seven times, at the positions $t_1$–$t_7$, likewise as the reference beam. In this embodiment, the beam may have a width of only ¼.a, in which a is the height of the beam splitter 5, whereas the beam width may be ½.a in the embodiment shown in FIG. 21.

Figure 23:
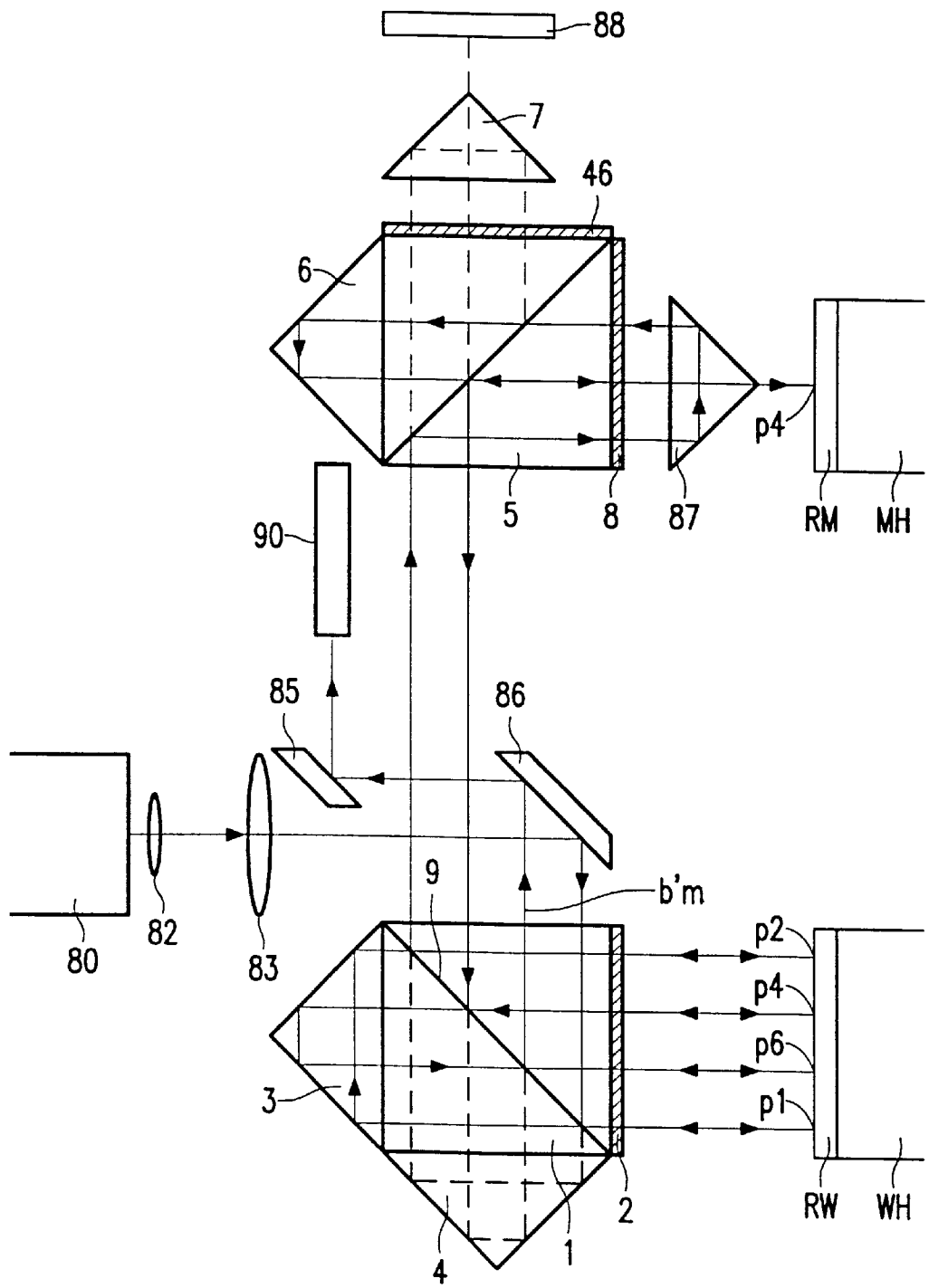
FIGS. 23 and 24 show two further embodiments of a differential interferometer system in which the effect of a rotation or tilt of the substrate holder is eliminated.

FIG. 23 shows a further embodiment of the differential interferometer system in which the rotation of the substrate reflector RW is compensated because the measuring beam $b_m$ undergoes an odd number of reflections upon its passage through the mask interferometer sub-system. This Figure also shows the required radiation source 80, for example a HeNe Zeeman laser, and two lenses 82 and 83 which constitute a beam-widening optical system. The substrate interferometer has the same structure as that in FIG. 1. The mask interferometer differs from that shown in FIG. 1 in that a retroreflector 87 replacing the reflector MI in FIG. 1 is arranged between the λ/4 plate 8 and the substrate reflector RM. Moreover, the path of the reference beam incorporates a λ/4 plate 46 and an extra reflector 88 is arranged above the retroreflector 7. The measuring beam $b_m$ coming from the position P2 on the substrate reflector is reflected to the retroreflector 87 by the interface 10 of the beam splitter 5. Via reflections on the oblique sides of this reflector, the measuring beam is sent to the retroreflector 6. This reflector subsequently passes the measuring beam to the mask reflector RM. The measuring beam reflected at the position P4 of this reflector is reflected by the interface 10 to the substrate interferometer. After having been reflected by the substrate reflector consecutively at the positions P5 and P6, the measuring beam $b'_m$ is sent to the detector 90 via the reflectors 86 and 85. The reference beam $b_r$ coming from the substrate interferometer is passed by the interface 10 towards the retroreflector 7 by which it is reflected to the interface 10 again. This interface then reflects the reference beam to the retroreflector 6 which reflects the reference beam to the interface 10 again. This interface subsequently reflects the reference beam to the reflector 88. The reference beam reflected by the reflector 88 is then passed by the interface 10 towards the substrate interferometer.

Figure 24:
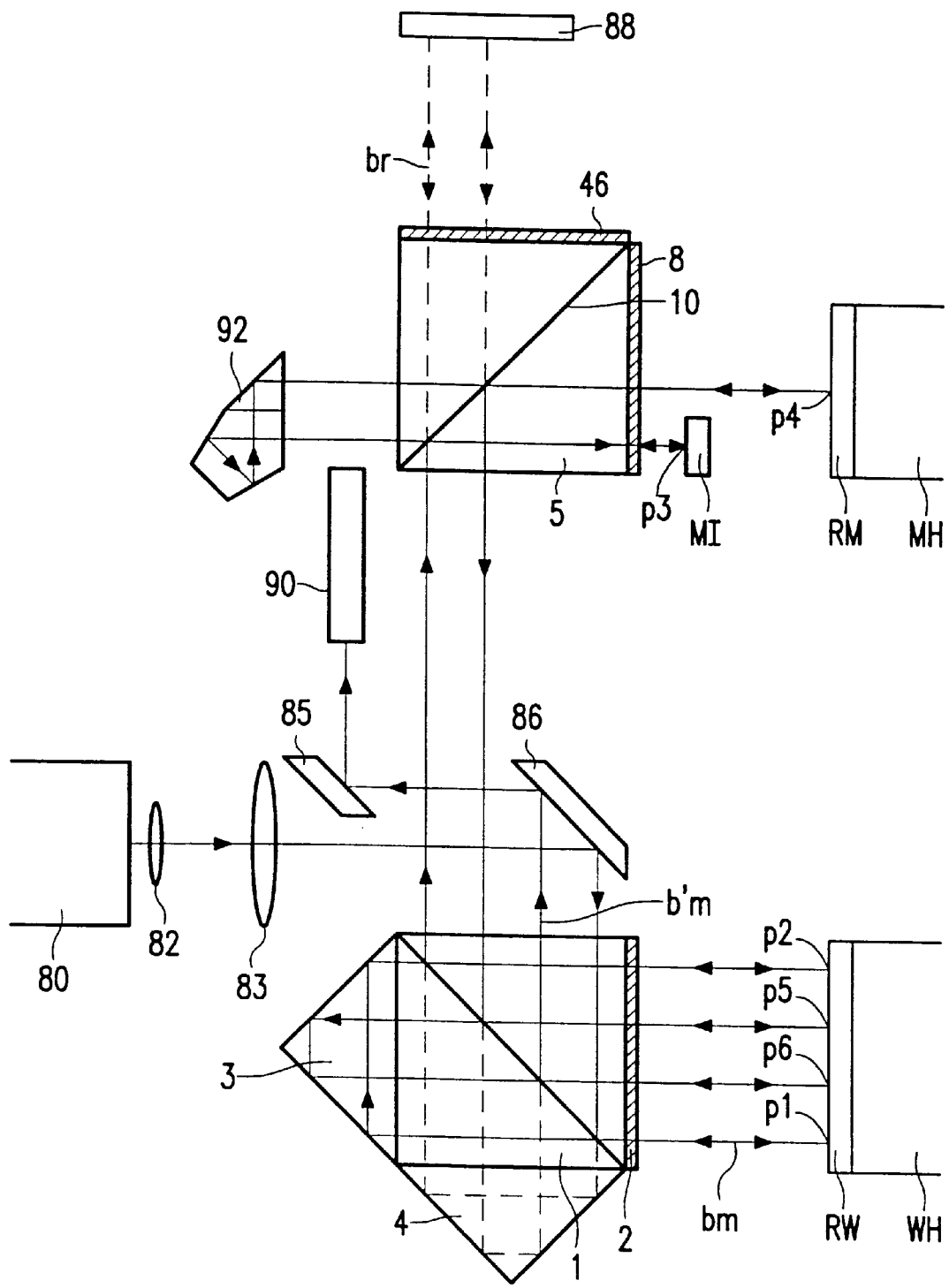

FIG. 24 shows an alternative to the embodiment shown in FIG. 23, in which the retroreflectors 7 and 87 in the mask interferometer have been replaced by a penta-prism unit 92 and a reflector MI. The measuring beam $b_m$ coming from the substrate interferometer is reflected by the interface 10 to the reflector MI which reflects the measuring beam to the unit 92. This unit reflects the measuring beam to the position P4 on the mask reflector RM. The measuring beam coming from the position P4 is reflected by the interface 10 towards the substrate interferometer. The reference beam $b_r$ coming from the substrate interferometer is passed by the interface 10 towards the reflector 88 which reflects this beam to the interface again. This interface then reflects the reference beam to the unit 92 which sends the reference beam to the interface again. This interface subsequently reflects the beam to the reflector 88 which sends the beam to the substrate interferometer via the interface 10.

Figure 25:
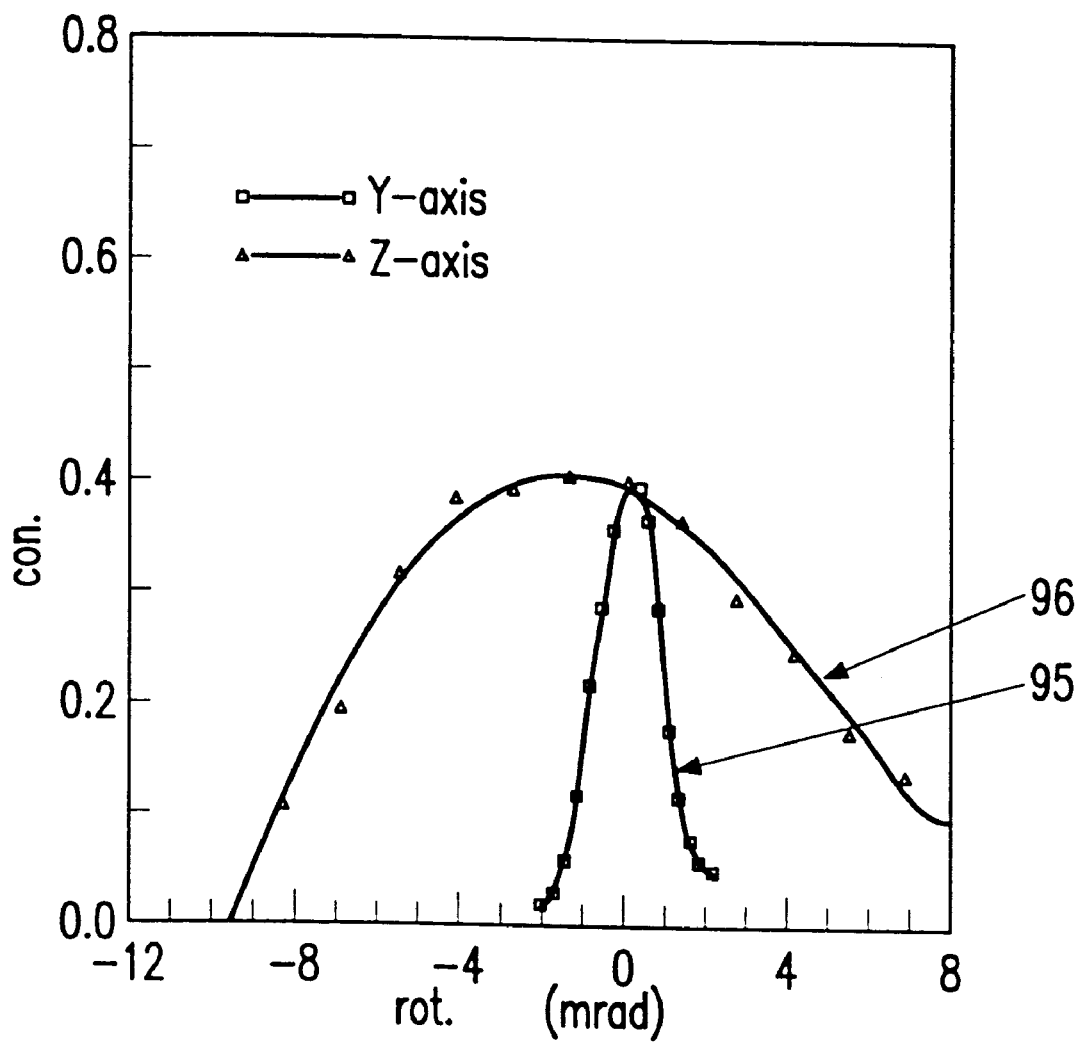
FIG. 25 shows the effect of a rotation or tilt of the substrate holder on the interferometer signal when using or not using an offset compensation.

FIG. 25 illustrates the effect of the described compensation by means of an odd number of reflections in the mask interferometer. This Figure shows the contrast (con) in the interferometer signal as a function of the rotation (rot in mrad) of the substrate reflector. The curve 95 applies to the case where there is no compensation and the curve 96 applies to the case where said compensation is used.

Figure 26A:
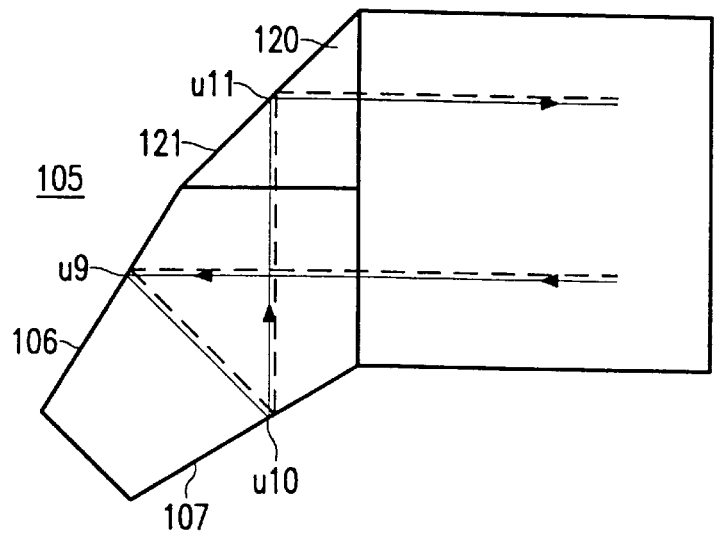
FIGS. 26a, 26b and 26c show a single interferometer system in which the beam offset caused by a rotation or tilt of the substrate holder is compensated.
Figure 26B:
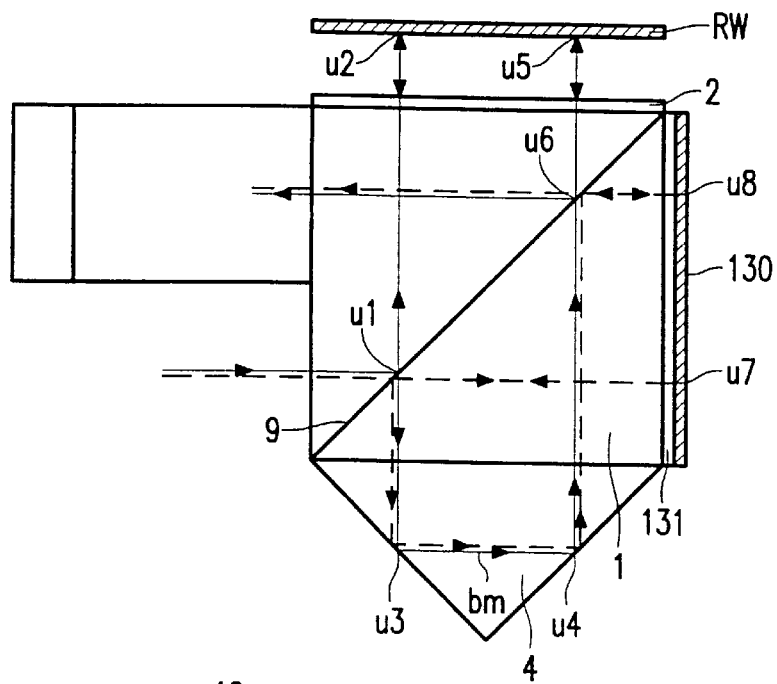
Figure 26C:
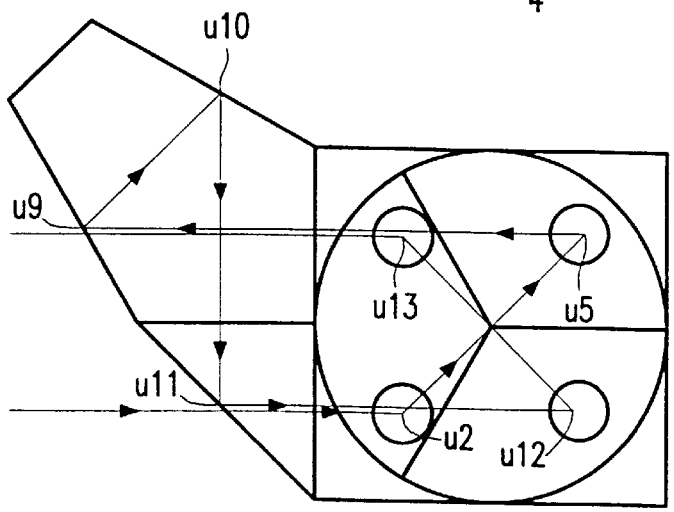

The described compensation for the substrate reflector tilt or rotation may not only be used in a differential interferometer system but also in a single system, i.e. an interferometer system having only one interferometer unit, which system is used, for example in a stepping lithographic projection apparatus, in which apparatus only the position and the movement of the substrate holder are measured with an interferometer system. FIGS. 26a, 26b and 26c show an embodiment of such an interferometer system in different cross-sections.

As is shown in FIG. 26b, the incoming measuring beam is first passed, via reflection $u_1$ on the interface 9 of the beam splitter 1, to the substrate reflector RW where it is reflected at the position $u_2$. Subsequently, the measuring beam traverses the beam splitter 1 via reflections at the positions $u_3$ and $u_4$ of the retroreflector 4 so as to be subsequently reflected once more at the position $u_5$ by the substrate reflector, after which it leaves the beam splitter via reflection on the interface 9. The reference beam is reflected consecutively at the positions $u_7$, $u_3$, $u_4$, $u_6$ and $u_8$, thus, inter alia, twice on a reference reflector 130, via the $\lambda/4$ plate 131. The measuring beam and reference beam coming from the beam splitter 1 are subsequently reflected by the faces 126, 127 and 121 of the prisms 125 and 120, respectively, at the positions $u_9$, $u_{10}$ and $u_{11}$, as is shown in FIG. 26a, whereafter these beams again enter the beam splitter 1. As is shown in FIG. 26c, the measuring beam is subsequently reflected at the positions $u_{13}$ and $u_{14}$ of the substrate reflector. The measuring beam and reference beam coming from the beam splitter thus undergo three reflections before they re-enter the beam splitter.

It has been assured in the foregoing that the position of the mask and the substrate can be measured in one direction only, the scanning direction or the X direction. As descried in EP Patent Application 0 498 499, a substrate interferometer system having five measuring axes may be used in a stepping lithographic projection apparatus, not only for measuring the X position but also the Y position, the rotation of the substrate about the optical axis, or Z axis, and the tilts of the substrate about the X and Y axes. For example, two interferometer units are then used, one of which has three measuring axes and the other has two measuring axes. Also the differential interferometer system may be extended to five measuring axes, the system then having five measuring axes, for example, both at the location of the substrate and at the location of the mask, and a differential measurement takes place, for example, along all of these axes.

When the differential interferometer systems described above are used in a step-and-scan lithographic projection apparatus, the following advantages are obtained:

the interferometer measurements are insensitive to instabilities in the apparatus, these measurements are insensitive to position instabilities of the projection lens system, the measurements are insensitive to disturbances, such as air turbulences, between the mask interferometer and the substrate interferometer, no electronic delay time problems occur during scan-imaging of the mask pattern, the measurements are insensitive to rotation or tilts of the substrate holder, the resolving power of the measurements is increased, and the number of required interferometers is reduced.

The invention has been described with reference to its use in an apparatus for step-and-scan imaging of a mask pattern on a substrate for manufacturing integrated circuits. However, it may be alternatively used in such an apparatus for manufacturing integrated optical systems, planar optical systems, guidance and detection patterns for magnetic domain memories, or liquid crystalline image display panels. The projection apparatus may not only be a photolithographic apparatus, in which the projection beam is a beam of electromagnetic radiation such as deep UV radiation, and in which the projection system is an optical projection lens system, but also an apparatus in which the projection radiation is a charged-particle radiation such as electron radiation, ion radiation or X-ray radiation and in which an associated projection system, for example, an electron lens system is used.

We claim:

1. An interferometer system for measuring a mutual position and movement of a first and a second object in at least one direction, said system comprising, for at least one of all possible mutual directions of movement:

a first interferometer unit, associated with the first object, provided with a first beam splitter, a first measuring reflector and a plurality of first reflectors, and a second interferometer unit, associated with the second object, provided with a second beam splitter, a second measuring reflector and a plurality of second reflectors, characterized in that, in operation, a measuring beam passes through both the first and the second interferometer unit and is reflected at least once by both the first measuring reflector and the second measuring reflector, in that the first and second interferometer units have the same radiation-sensitive detector, and in that a reference beam associated with the measuring beam traverses the same path as the measuring beam between the first and the second interferometer unit.

2. An interferometer system as claimed in claim 1, for measuring the mutual positions of a first object, moving at a speed v, and a second object, moving at a speed n.v, in which n is an integer, characterized in that the ratio between the number of times the measuring beam is reflected by the measuring reflector associated with the first object and the number of times the measuring beam is reflected by the measuring reflector associated with the second object is equal to n.

3. An interferometer system as claimed in claim 1, characterized in that, for the purpose of eliminating the influence of a rotation or tilt of the first object on the interferometer signal, the second interferometer unit is adapted in such a way that the measuring beam coming from the first interferometer unit is reflected m+1 times in the second interferometer unit before returning to the first interferometer unit, m being an even number which is larger than 2.

4. An apparatus for multi-imaging a mask pattern on a substrate in accordance with a step-and-scan principle, which apparatus comprises a mask holder arranged in a mask table, a substrate holder arranged in a substrate table, and a projection system arranged between the mask table and the substrate table, characterized by an interferometer system as claimed in claim 1, for measuring the mutual position of the mask and the substrate constituting the first and the second object.

5. An apparatus as claimed in claim 4, in which the mask pattern is imaged on the substrate with a magnification M, characterized in that the ratio between the number of times the measuring beam is reflected by the measuring reflector associated with the substrate and the number of times the measuring beam is reflected by the measuring reflector associated with a mask is equal to 1/M.

6. An apparatus as claimed in claim 4, characterized in that a measuring reflector associated with the substrate and a measuring reflector associated with the mask are constituted by a reflecting side face of the substrate holder and the mask holder, respectively.

7. An apparatus as claimed in claim 4, characterized in that the interferometer system comprises a projection system interferometer unit for measuring the position of the projection system at one location, and in that the projection system is provided with an extra measuring reflector at said location.

8. An apparatus as claimed in claim 7, characterized in that the projection system interferometer unit is traversed by said reference beam.

9. An apparatus as claimed in claim 4, characterized in that the projection system is provided with two further measuring reflectors at locations proximate to the mask holder and proximate to the substrate holder, respectively, and in that said reference beam is reflected by both measuring reflectors.

10. An interferometer system as claimed in claim 2, characterized in that, for the purpose of eliminating the influence of a rotation or tilt of the first object on the interferometer signal, the second interferometer unit is adapted in such a way that the measuring beam coming from the first interferometer unit is reflected m+1 times in the second interferometer unit before returning to the first interferometer unit, m being an even number which is larger than 2.

11. An apparatus for multi-imaging a mask pattern on a substrate in accordance with the step-and-scan principle, which apparatus comprises a mask holder arranged in a mask table, a substrate holder arranged in a substrate table, and a projection system arranged between the mask table and the substrate table, characterized by an interferometer system as claimed in claim 2, for measuring the mutual position of the mask and the substrate constituting the first and the second object.

12. An apparatus as claimed in claim 5, characterized in that a measuring reflector associated with the substrate and a measuring reflector associated with the mask are constituted by a reflecting side face of the substrate holder and the mask holder, respectively.

13. An apparatus as claimed in claim 5, characterized in that the interferometer system comprises a projection system interferometer unit for measuring the position of the projection system at one location, and in that the projection system is provided with an extra measuring reflector at said location.

14. An apparatus as claimed in claim 6, characterized in that the interferometer system comprises a projection system interferometer unit for measuring the position of the projection system at one location, and in that the projection system is provided with an extra measuring reflector at said location.

* * * * *